United States Patent
Liaptsis et al.

(10) Patent No.: US 11,165,035 B2
(45) Date of Patent: Nov. 2, 2021

(54) ORGANIC ELECTROLUMINESCENT DEVICE EMITTING BLUE LIGHT

(71) Applicant: CYNORA GMBH, Bruchsal (DE)

(72) Inventors: Georgios Liaptsis, Mannheim (DE); Jan Birnstock, Dresden (DE)

(73) Assignee: CYNORA GMBH, Bruchsal (DE)

( * ) Notice: Subject to any disclaimer, the term of this patent is extended or adjusted under 35 U.S.C. 154(b) by 236 days.

(21) Appl. No.: 16/400,767

(22) Filed: May 1, 2019

(65) Prior Publication Data

US 2019/0341571 A1 Nov. 7, 2019

(30) Foreign Application Priority Data

May 4, 2018 (EP) .................................... 18170767

(51) Int. Cl.
*H01L 51/30* (2006.01)
*H01L 51/50* (2006.01)
*H01L 51/52* (2006.01)
*H01L 51/00* (2006.01)

(52) U.S. Cl.
CPC ...... *H01L 51/5024* (2013.01); *H01L 51/5016* (2013.01); *H01L 51/5032* (2013.01); *H01L 51/5296* (2013.01); *H01L 51/0035* (2013.01); *H01L 51/0056* (2013.01); *H01L 51/0059* (2013.01); *H01L 51/0071* (2013.01); *H01L 51/0094* (2013.01); *H01L 51/5056* (2013.01); *H01L 51/5072* (2013.01); *H01L 2251/552* (2013.01)

(58) Field of Classification Search
CPC ............. H01L 51/5024; H01L 51/5016; H01L 51/5032; H01L 51/0035; H01L 51/0056; H01L 51/0059; H01L 51/0071; H01L 51/0094
USPC ......................................................... 362/84
See application file for complete search history.

(56) References Cited

U.S. PATENT DOCUMENTS

| 2012/0217869 | A1* | 8/2012 | Adachi ................. H05B 33/14 313/504 |
| 2015/0236274 | A1 | 8/2015 | Hatakeyama et al. |
| 2016/0093823 | A1 | 3/2016 | Seo et al. |
| 2017/0092889 | A1* | 3/2017 | Seo ........................ C09K 11/06 |
| 2017/0092890 | A1* | 3/2017 | Seo ...................... H01L 51/5016 |
| 2018/0370957 | A1* | 12/2018 | Gao ...................... H01L 51/008 |
| 2019/0135797 | A1* | 5/2019 | Gao ...................... H01L 51/5096 |
| 2019/0386235 | A1* | 12/2019 | Duan ................... H01L 51/5004 |
| 2020/0119286 | A1* | 4/2020 | Liaptsis ............... H01L 51/0072 |

FOREIGN PATENT DOCUMENTS

EP 3226318 A1 10/2017

OTHER PUBLICATIONS

Hatakeyama et al., "Ultrapure Blue Thermally Activated Delayed Fluorescence Molecules: Efficient Homo-Lumo Separation by the Multiple Resonance Effect", Adv. Mater. 2016, 28, pp. 2777-2781.
Okinaka et al., "New Fluorescent Blue Host Materials for Achieving Low Voltage in OLEDs", SID 2015 Digest, 46 (1); pp. 312-315.

* cited by examiner

*Primary Examiner* — Christopher M Raabe
(74) *Attorney, Agent, or Firm* — J.A. Lindeman & Co., PLLC

(57) ABSTRACT

The present invention relates to organic electroluminescent devices comprising a light-emitting layer B comprising two host materials, a n-type (electron-transporting) and a p-type (hole-transporting) host material, a thermally activated delayed fluorescence (TADF) material and an emitter material, which exhibits a narrow—expressed by a small full width at half maximum (FWHM)—deep-blue emission at an emission maximum of 440 to 475 nm. Further, the present invention relates to a method for generating blue light by means of an organic electroluminescent device according to the present invention.

16 Claims, No Drawings

ORGANIC ELECTROLUMINESCENT DEVICE EMITTING BLUE LIGHT

The present invention relates to organic electroluminescent devices comprising a light-emitting layer B comprising two host materials, a n-type (electron-transporting) and a p-type (hole-transporting) host material, a thermally activated delayed fluorescence (TADF) material and an emitter material, which exhibits a narrow—expressed by a small full width at half maximum (FWHM)—deep-blue emission at an emission maximum of 440 to 475 nm. Further, the present invention relates to a method for generating blue light by means of an organic electroluminescent device according to the present invention.

DESCRIPTION

Organic electroluminescent devices containing one or more light-emitting layers based on organics such as, e.g., organic light emitting diodes (OLEDs), light emitting electrochemical cells (LECs) and light-emitting transistors gain increasing importance. In particular, OLEDs are promising devices for electronic products such as e.g. screens, displays and illumination devices. In contrast to most electroluminescent devices essentially based on inorganics, organic electroluminescent devices based on organics are often rather flexible and producible in particularly thin layers. The OLED-based screens and displays already available today bear particularly beneficial brilliant colors, contrasts and are comparably efficient with respect to their energy consumption.

A central element of an organic electroluminescent device for generating light is a light-emitting layer placed between an anode and a cathode. When a voltage (and current) is applied to an organic electroluminescent device, holes and electrons are injected from an anode and a cathode, respectively, to the light-emitting layer. Typically, an hole transport layer is located between light-emitting layer and the anode, and an electron transport layer is located between light-emitting layer and the cathode. The different layers are sequentially disposed. Excitons of high energy are then generated by recombination of the holes and the electrons. The decay of such excited states (e.g., singlet states such as S1 and/or triplet states such as T1) to the ground state (S0) desirably leads to light emission.

In order to enable efficient energy transport and emission, an organic electroluminescent device comprises one or more host compounds and one or more emitter compounds as dopants. Challenges when generating organic electroluminescent devices are thus the improvement of the illumination level of the devices (i.e., brightness per current), obtaining a desired light spectrum and achieving suitable (long) lifespans.

There is still a need for efficient and stable OLEDs that emit in the deep blue region of the visible light spectrum, which would be expressed by a small $CIE_y$ value. Accordingly, there is still the unmet technical need for organic electroluminescent devices which have a long lifetime and high quantum yields, in particular in the deep blue range.

Exciton-polaron interaction (triplet-polaron and singlet-polaron interaction) as well as exciton-exciton interaction (singlet-singlet, triplet-singlet, and triplet-triplet interaction) are major pathways for device degradation. Degradation pathways such as triplet-triplet annihilation (TTA) and triplet-polaron quenching (TPQ) are of particular interest for deep-blue emitting devices, as high energy states are generated. In particular, charged emitter molecules are prone to high energy excitons and/or polarons. To separate polarons and/or excitons, so-called mixed-host systems are employed, but this approach is limited due to the lack of stable n-type host materials with the lowest triplet state at an energy sufficient to not quench the excitons located at the emitter.

Another interesting parameter is the onset of the emission of the emitter expressed by the S1 energy. High energy photons, particularly in combination with further polarons or excited states, may lead to degradation of the organic materials, if the bond dissociation energy (BDE) of the weakest bond is exceeded.

As a consequence, the S1 energy of the emitter contributing the main component of the emission should be as low as possible and thus an emitter with a small FWHM needs to be employed for deep-blue emissive OLEDs. In addition, other materials—such as the host materials—should not contribute to the emission, as the S1 energy of the host needs to be even higher in energy than the one of the emitter to avoid quenching. Consequently, an efficient energy transfer from all materials within the emission layer to the emitter material is required.

Within the organic electroluminescent device comprising the two host materials, the TADF material and the small FWHM emitter material, an effective separation of excitons and polarons is achieved.

Surprisingly, it has been found that an organic electroluminescent device's light-emitting layer comprising two host materials, a n-type (electron-transporting) and a p-type (hole-transporting) host material, a thermally activated delayed fluorescence (TADF) material and an emitter material, which exhibits a narrow—expressed by a small full width at half maximum (FWHM)—deep-blue emission, provides an organic electroluminescent device having good lifetime and quantum yields and exhibiting deep blue emission. Herein, the main emission of the device occurs from the small FWHM emitter material, which in particular is a near-range charge transfer (NRCT) emitter.

Surprisingly, energy transfer within the device is nevertheless sufficient enough to yield a deep-blue emission with small FWHM and thus a low CIEy color coordinate.

Accordingly, one aspect of the present invention relates an organic electroluminescent device comprising a light-emitting layer B comprising:
(i) a host material $H^N$, which has a lowermost excited singlet state energy level $S1^N$, a lowermost excited triplet state energy level $T1^N$, a highest occupied molecular orbital $HOMO(H^N)$ having an energy $E^{HOMO}(H^N)$ and a lowest unoccupied molecular orbital $LUMO(H^N)$ having an energy $E^{LUMO}(H^N)$;
(ii) a host material $H^P$, which has a lowermost excited singlet state energy level $S1^P$ and a lowermost excited triplet state energy level $T1^P$, a highest occupied molecular orbital $HOMO(H^P)$ having an energy $E^{HOMO}(H^P)$ and a lowest unoccupied molecular orbital $LUMO(H^P)$ having an energy $E^{LUMO}(H^P)$;
(iii) a thermally activated delayed fluorescence (TADF) material $E^B$, which has a lowermost excited singlet state energy level $S1^E$ and a lowermost excited triplet state energy level $T1^E$, a highest occupied molecular orbital $HOMO(E^E)$ having an energy $E^{HOMO}(E^E)$ and a lowest unoccupied molecular orbital $LUMO(E^E)$ having an energy $E^{LUMO}(E^E)$; and
(iv) a small FWHM emitter $S^B$, which has a lowermost excited singlet state energy level $S1^S$ and a lowermost excited triplet state energy level $T1^S$, a highest occupied molecular orbital $HOMO(E^S)$ having an energy $E^{HOMO}$ ($E^S$) and a lowest unoccupied molecular orbital LUMO ($E^S$) having an energy $E^{LUMO}(E^S)$, wherein $S^B$ emits light with an emission maximum $\lambda_{max}^{PMMA}(S)$ of 440 nm to 475 nm,
wherein the relations expressed by the following formulas (1) to (3) and at least one of (4a) or (4b) apply:

$$S1^N > S1^E \tag{1}$$

$$S1^P > S1^E \tag{2}$$

$$E^{LUMO}(H^N) - E^{HOMO}(H^P) > S1^E \tag{3}$$

$$E^{LUMO}(H^P) - E^{LUMO}(H^N) \geq 0.2 \text{ eV} \tag{4a}$$

$$E^{HOMO}(H^P) - E^{HOMO}(H^N) \geq 0.2 \text{ eV} \tag{4b},$$

and wherein the relations expressed by the following formulas (5) to (8) apply:

$$S1^N > S1^S \tag{5}$$

$$S1^P > S1^S \tag{6}$$

$$S1^E > S1^S \tag{7}$$

$$S1^S < 2.95 \text{ eV} \tag{8}.$$

According to the invention, the lowermost excited singlet state of the host material $H^B$ is higher in energy than the lowermost excited singlet state of the thermally activated delayed fluorescence (TADF) material $E^B$. The lowermost excited singlet state of the host material $H^N$ is higher in energy than the lowermost excited singlet state of the TADF material $E^B$.

The energy difference between the lowest unoccupied molecular orbital (LUMO) of the host material $H^N$ and the highest occupied molecular orbital (HOMO) of the host material $H^P$ is larger than the energy of the lowermost excited singlet state of the thermally activated delayed fluorescence (TADF) material $E^B$.

The highest occupied molecular orbital (HOMO) of the host material $H^P$ is at least 0.20 eV higher in energy than the HOMO of the host material $H^N$, i.e. the $E^{HOMO}(H^P)$ is less negative than $E^{HOMO}(H^N)$ by at least 0.20 eV. The energy difference between the LUMO of $H^N$ and the HOMO of $H^P$ must be larger than the difference between the HOMO of $H^N$ and the HOMO of $H^P$ ($E^{LUMO}(H^N) - E^{HOMO}(H^P) > E^{HOMO}(H^P) - E^{HOMO}(H^N)$). In a preferred embodiment, the HOMO of the host material $H^P$ is more than 0.20 eV, more preferred more than 0.25 eV or even more preferably more than 0.30 eV higher in energy than the HOMO of the host material $H^N$. Typically, the HOMO of the host material $H^P$ is less than 4.0 eV, more preferred less than 3.0 eV, even more preferably less than 2.0 eV or even less than 1.0 eV higher in energy than the HOMO of the host material $H^N$.

Alternatively the lowest unoccupied molecular orbital (LUMO) of the host material $H^P$ is at least 0.20 eV higher in energy than the LUMO of the host material $H^N$, i.e. the $E^{LUMO}(H^P)$ is less negative than $E^{LUMO}(H^N)$ by at least 0.20 eV. The energy difference between the LUMO of $H^N$ and the HOMO of $H^P$ must be larger than the difference between the LUMO of $H^N$ and the LUMO of $H^P$ ($E^{LUMO}(H^N) - E^{HOMO}(H^P) > E^{LUMO}(H^P) - E^{LUMO}(H^N)$). In a preferred embodiment, the LUMO of the host material $H^P$ is more than 0.20 eV, more preferred more than 0.25 eV or even more preferably more than 0.30 eV higher in energy than the LUMO of the host material $H^N$. Typically, the LUMO of the host material $H^P$ is less than 4.0 eV, more preferred less than 3.0 eV, even more preferably less than 2.0 eV or even less than 1.0 eV higher in energy than the LUMO of the host material $H^N$.

The lowermost excited singlet state of the host material $H^B$ is higher in energy than the lowermost excited singlet state of the small FWHM emitter $S^B$. The lowermost excited singlet state of the host material $H^N$ is higher in energy than the lowermost excited singlet state of $S^B$. The lowermost excited singlet state of the TADF material $E^B$ is higher in energy than the lowermost excited singlet state of $S^B$. The lowermost excited singlet state of $S^B$, i.e. the onset of the emission spectrum of $S^B$, is smaller than 2.95 eV, preferably smaller than 2.90 eV, more preferably smaller than 2.85 eV, even more preferably smaller than 2.80 eV or even smaller than 2.75 eV.

Surprisingly it was found, that the main contribution to the emission band of the optoelectronic device according to the invention can be attributed to the emission of $S^B$ indicating a sufficient transfer of energy transfer from $E^B$ to $S^B$ and from the host materials $H^P$ and $H^N$ to $E^B$ and/or $S^B$.

In one embodiment, the highest occupied molecular orbital (HOMO) of the host material $H^P$ is at least 0.20 eV higher in energy than the HOMO of the host material $H^N$ and the lowest unoccupied molecular orbital (LUMO) of the host material $H^P$ is at least 0.20 eV higher in energy than the LUMO of the host material $H^N$. In a preferred embodiment, the HOMO of the host material $H^P$ is more than 0.20 eV, more preferred more than 0.25 eV or even more preferably more than 0.30 eV higher in energy than the HOMO of the host material $H^N$ and the LUMO of the host material $H^P$ is more than 0.20 eV, more preferred more than 0.25 eV or even more preferably more than 0.30 eV higher in energy than the LUMO of the host material $H^N$.

In one embodiment, $H^P$ and $H^N$ form an exciplex. The person skilled in the art knows how to choose pairs of $H^P$ and $H^N$, which form an exciplex and the selection criteria—in addition to the HOMO- and/or LUMO-energy level requirements described above—such as a low steric shielding of $H^P$ and $H^N$.

In one embodiment, $H^N$ is selected from the group consisting of the following or a mixture of two or more thereof:

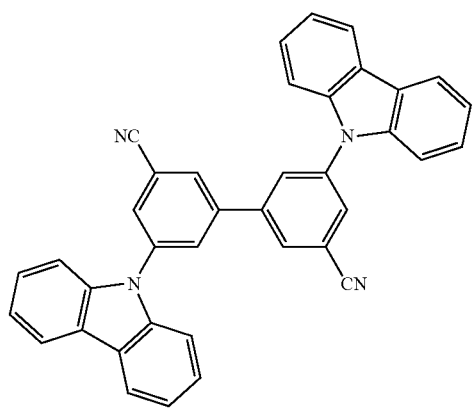

-continued
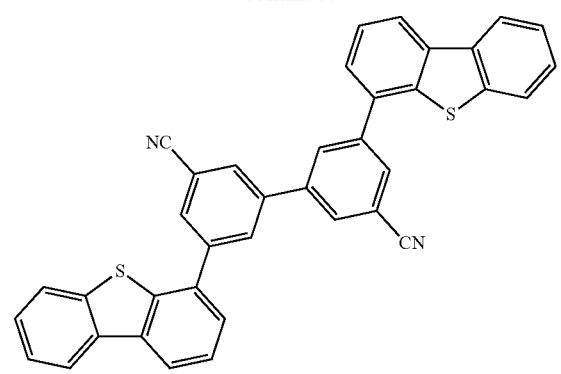
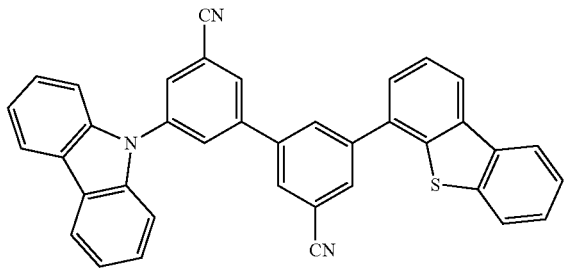
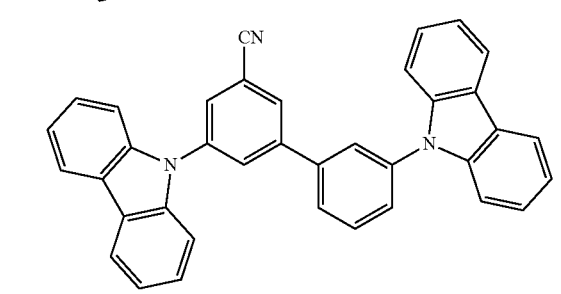
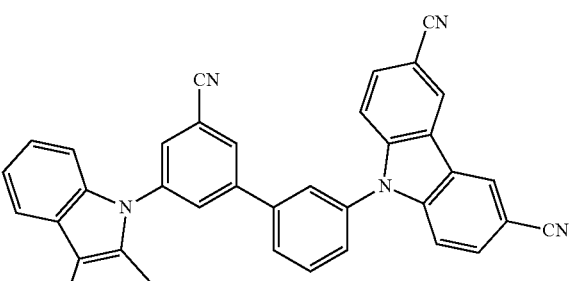
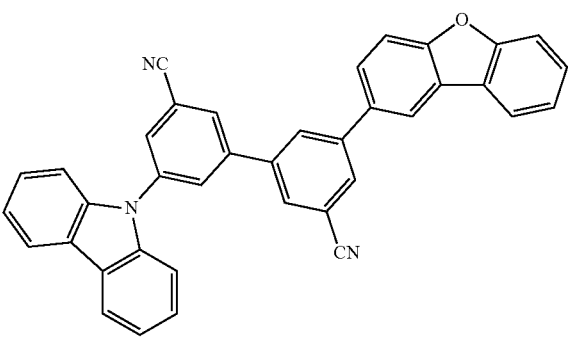
-continued
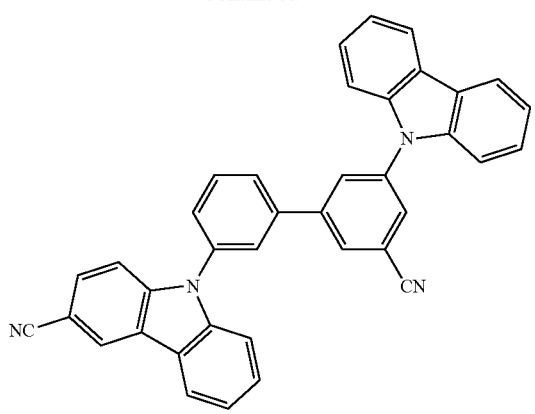
In one embodiment, H$^P$ is selected from the group consisting of the following or a mixture of two or more thereof:
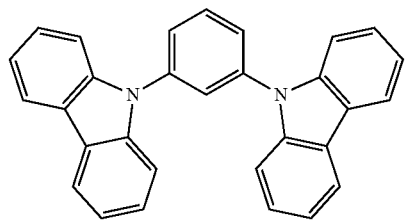
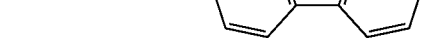

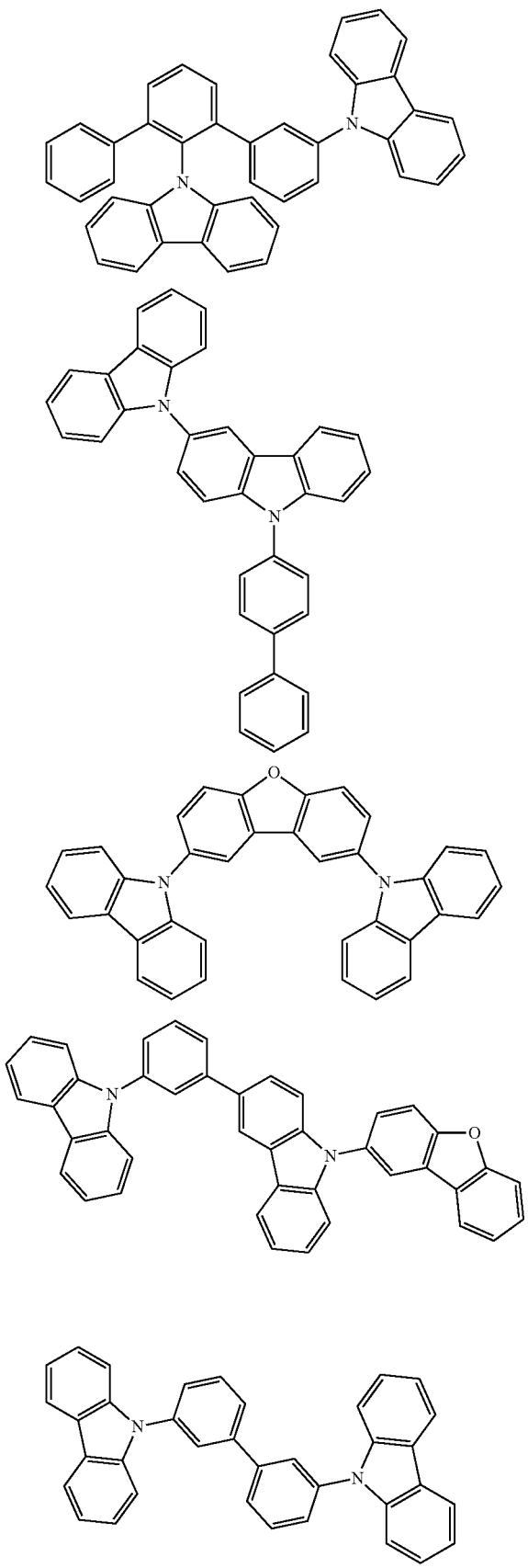

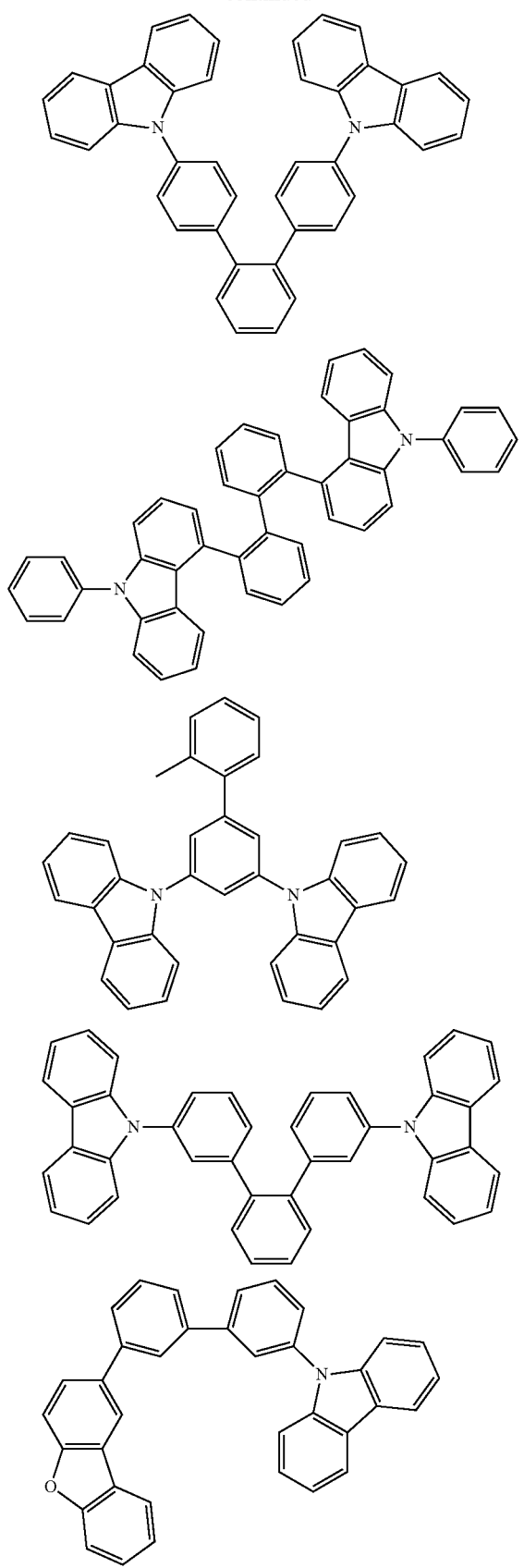
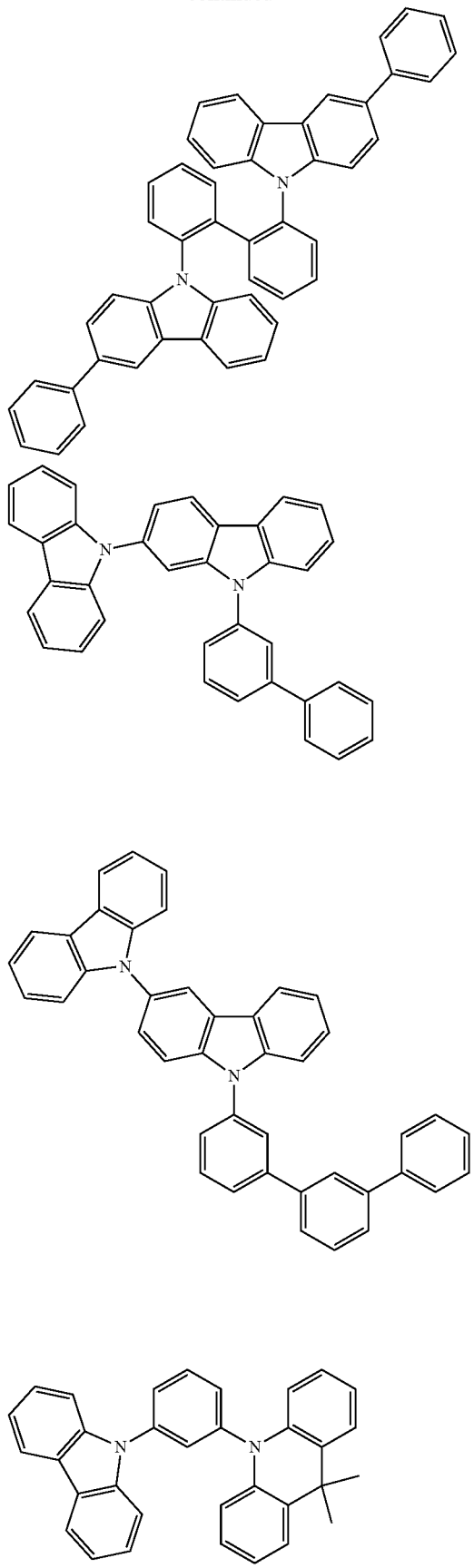

-continued
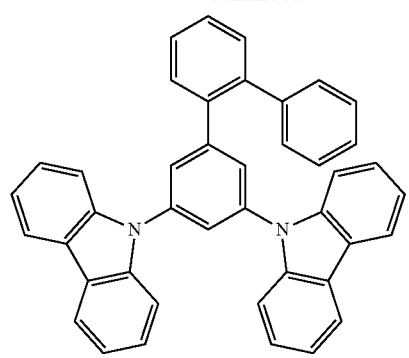
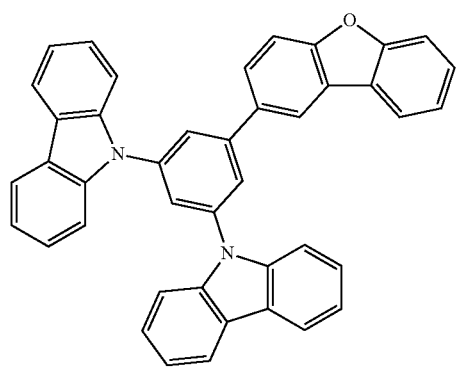
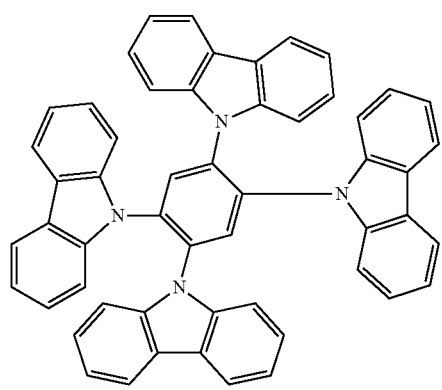
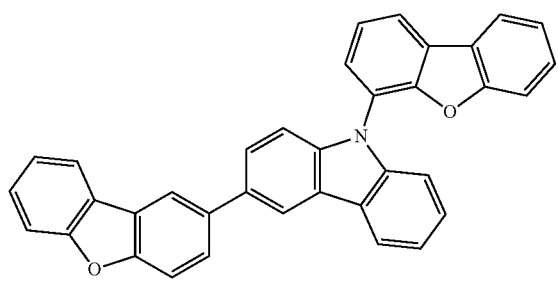
-continued
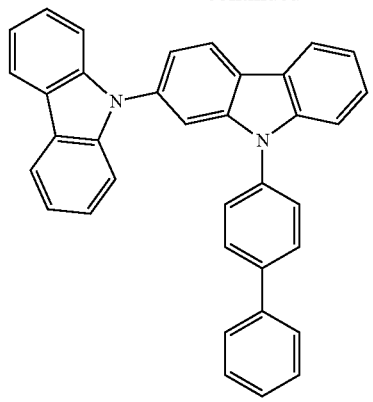
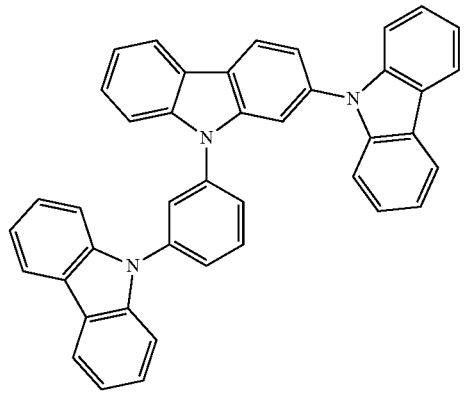
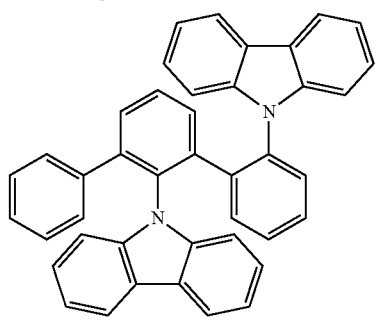
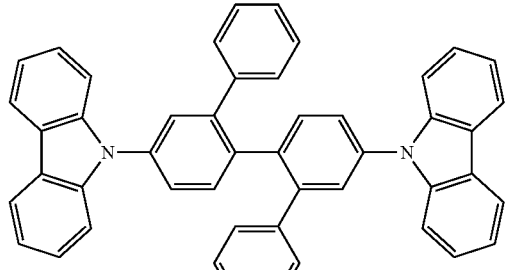
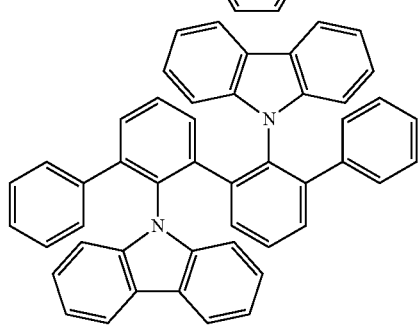

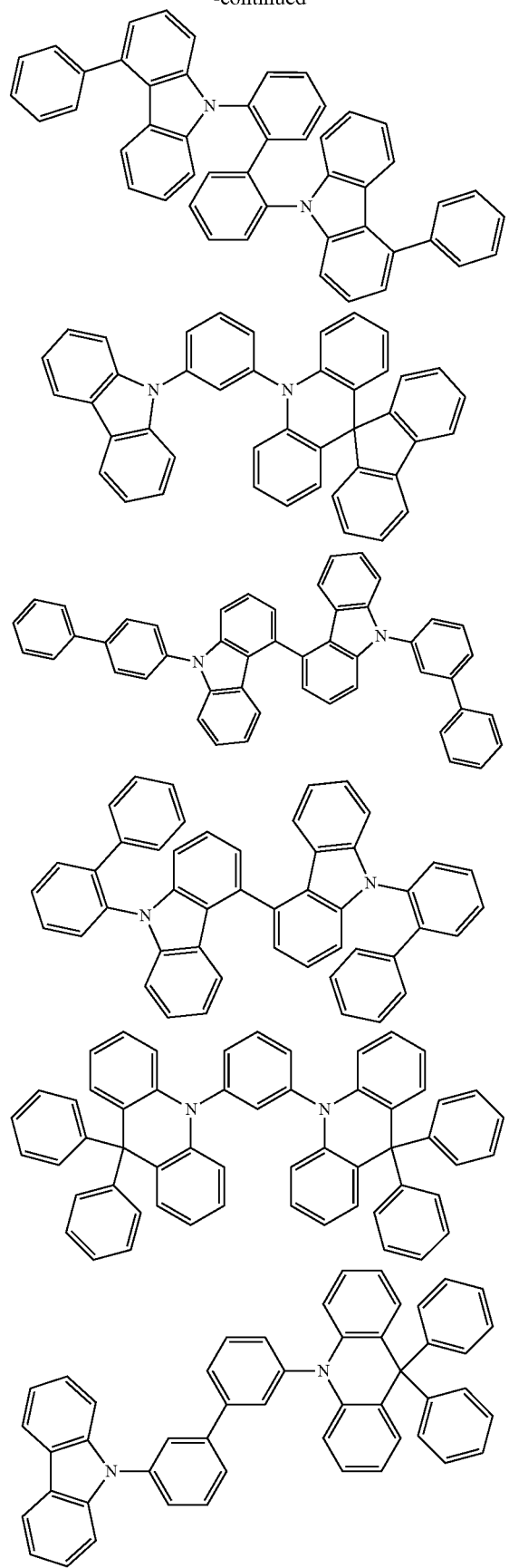
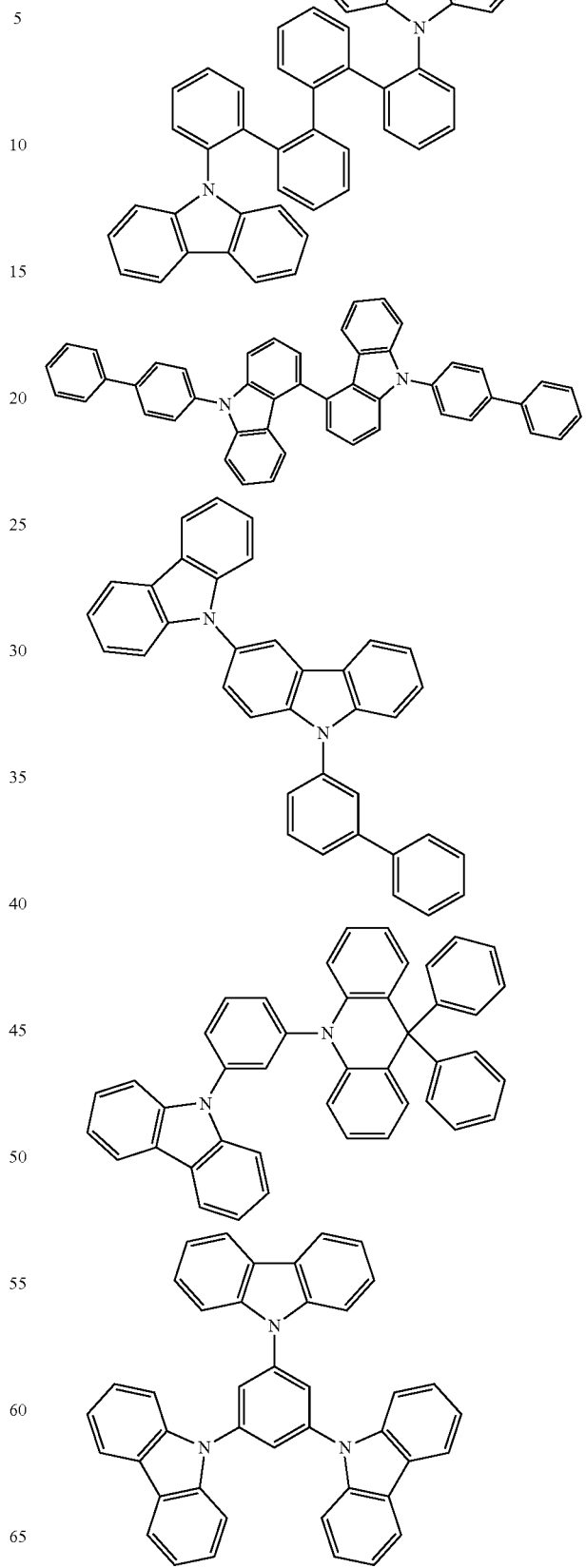

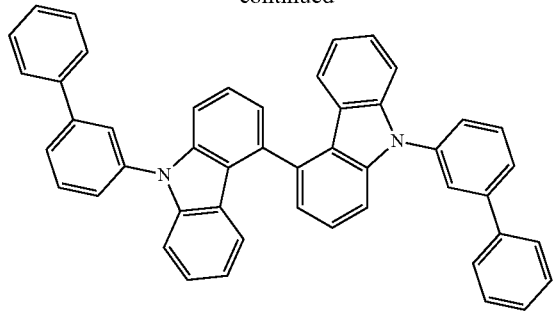

In one embodiment, $H^P$ and $H^N$ form an exciplex; $H^P$ and $S^B$ do not form an exciplex; $H^N$ and $S^B$ do not form an exciplex and $E^B$ and $S^B$ do not form an exciplex.

In one embodiment, $H^P$ and $H^N$ form an exciplex; $H^P$ and $E^B$ do not form an exciplex; $H^N$ and $E^B$ do not form an exciplex; $H^P$ and $S^B$ do not form an exciplex; $H^N$ and $S^B$ do not form an exciplex and $E^B$ and $S^B$ do not form an exciplex. Exciplex formation of $H^P$ and $E^B$; $H^N$ and $E^B$; $H^P$ and $S^B$; $H^N$ and $S^B$; or $E^B$ and $S^B$ In one embodiment, $H^N$ does not contain any phosphine oxide groups, in particular $H^N$ is not bis[2-(diphenylphosphino)phenyl] ether oxide (DPEPO).

As used herein, the terms "TADF material" and "TADF emitter" may be understood interchangeably.

According to the present invention, a TADF material is characterized in that it exhibits a $\Delta E_{ST}$ value, which corresponds to the energy difference between the lowermost excited singlet state (S1) and the lowermost excited triplet state (T1), of less than 0.4 eV, preferably less than 0.3 eV, more preferably less than 0.2 eV, even more preferably less than 0.1 eV or even less than 0.05 eV. A preferred route for determining T1 and S1 is described herein.

As used herein, the terms organic electroluminescent device and opto-electronic light-emitting devices may be understood in the broadest sense as any device comprising a light-emitting layer B comprising two host materials $H^P$ and $H^N$, a TADF material $E^B$ and a small FWHM emitter $S^B$.

The organic electroluminescent device may be understood in the broadest sense as any device based on organic materials that is suitable for emitting light in the visible or nearest ultraviolet (UV) range, i.e., in the range of a wavelength of from 380 to 800 nm. More preferably, organic electroluminescent device may be able to emit light in the visible range, i.e., of from 400 to 800 nm.

The small FWHM emitter $S^B$ is chosen to exhibit an emission with a full width at half maximum (FWHM) below 0.35 eV, preferably less than 0.30 eV, more preferably less than 0.25 eV, even more preferably less than 0.20 or even less than 0.15 eV in poly(methyl methacrylate) (PMMA)—analogously measured as $\lambda_{max}^{PMMA}$, i.e., with 10% by weight of the emitter, which is the small FWHM emitter $S^B$ in this case (wherein % by weight is related to the total content of PMMA and the emitter).

In a preferred embodiment, the organic electroluminescent device is a device selected from the group consisting of an organic light emitting diode (OLED), a light emitting electrochemical cell (LEC), and a light-emitting transistor.

Particularly preferably, the organic electroluminescent device is an organic light emitting diode (OLED). Optionally, the organic electroluminescent device as a whole may be intransparent, semi-transparent or (essentially) transparent.

The term "layer" as used in the context of the present invention preferably is a body that bears an extensively planar geometry.

The light-emitting layer B preferably bears a thickness of not more than 1 mm, more preferably not more than 0.1 mm, even more preferably not more than 10 µm, even more preferably not more than 1 µm, in particular not more than 0.1 µm.

In a preferred embodiment, the thermally activated delayed fluorescence (TADF) material $E^B$ is an organic TADF material. According to the invention, organic emitter or organic material means that the emitter or material (predominantly) consists of the elements hydrogen (H), carbon (C), nitrogen (N), boron (B), silicon (Si) and optionally fluorine (F), optionally bromine (Br) and optionally oxygen (O). Particularly preferably, it does not contain any transition metals.

In a preferred embodiment, the TADF material $E^B$ is an organic TADF material. In a preferred embodiment, the small FWHM emitter $S^B$ is an organic emitter. In a more preferred embodiment, the TADF material $E^B$ and the small FWHM emitter $S^B$ are both organic materials.

In a particularly preferred embodiment, the at least one TADF material $E^B$ is a blue TADF material, preferably a deep-blue TADF material.

The compounds $H^P$ and $H^N$ and the emitters $E^B$ and $S^B$ may be comprised in the organic electroluminescent device in any amount and any ratio.

In a preferred embodiment, in the organic electroluminescent device of the present invention, the light-emitting layer B comprises more compound $H^P$ than emitter $E^B$, according to the weight.

In a preferred embodiment, in the organic electroluminescent device of the present invention, the light-emitting layer B comprises more compound $H^N$ than emitter $E^B$, according to the weight.

In a preferred embodiment, in the organic electroluminescent device of the present invention, the light-emitting layer B comprises more TADF material $E^B$ than emitter $S^B$, according to the weight.

In a preferred embodiment, in the organic electroluminescent device of the present invention, the light-emitting layer B comprises:
(i) 10-84% by weight of the host compound $H^P$;
(ii) 10-84% by weight of the host compound $H^N$;
(iii) 5-50% by weight of the TADF material $E^B$; and
(iv) 1-10% by weight of the emitter $S^B$; and optionally
(v) 0-74% by weight of one or more solvents.

In another preferred embodiment, in the organic electroluminescent device of the present invention, the light-emitting layer B comprises:
(i) 10-30% by weight of the host compound $H^P$;
(ii) 40-74% by weight of the host compound $H^N$;
(iii) 15-30% by weight of the TADF material $E^B$; and
(iv) 1-5% by weight of the emitter $S^B$; and optionally
(v) 0-34% by weight of one or more solvents.

In a preferred embodiment, the TADF material $E^B$ exhibits an emission maximum (determined in poly(methyl methacrylate) (PMMA), $\lambda_{max}^{PMMA}(E^B)$) in the range from 440 to 470 nm. In a preferred embodiment, TADF material $E^B$ exhibits an emission maximum $\lambda_{max}^{PMMA}(E^B)$ in the range from 445 to 465 nm.

Device Wherein the Small FWHM Emitter $S^B$ is an Organic Blue Fluorescence Emitter In one embodiment of the invention, the small FWHM emitter $S^B$ is an organic blue fluorescence emitter.

In one embodiment, the small FWHM emitter $S^B$ is an organic blue fluorescence emitter selected from the following group:
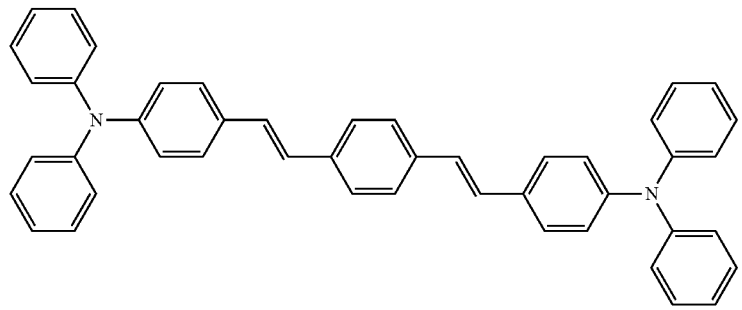
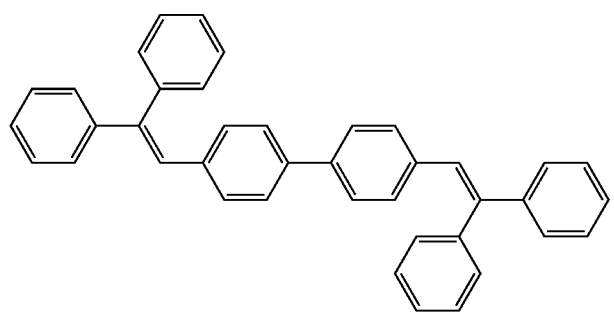
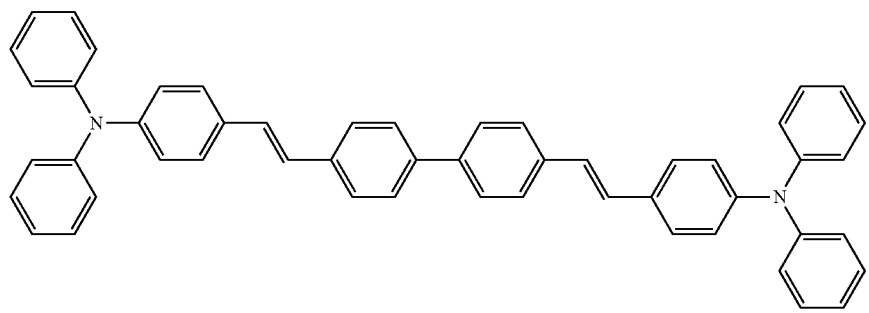
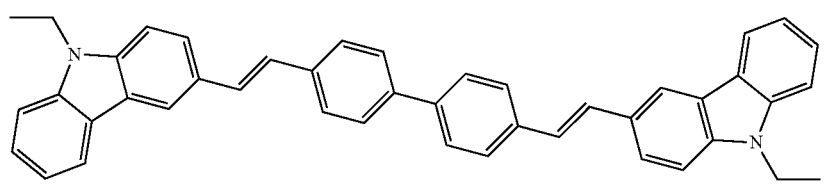

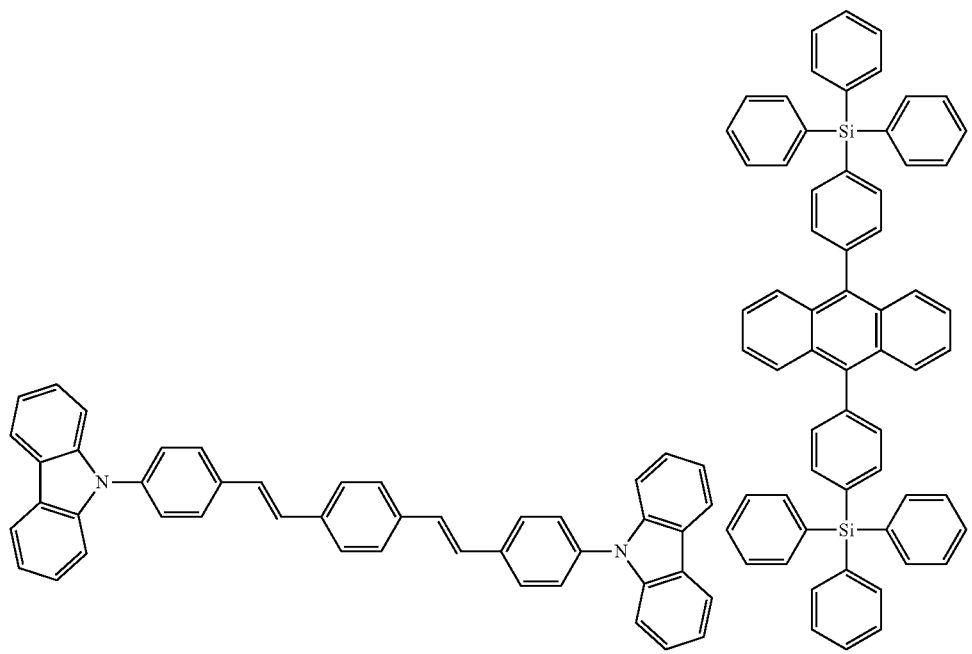
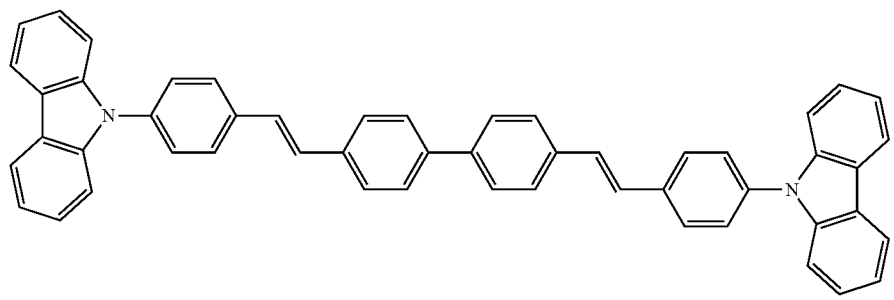
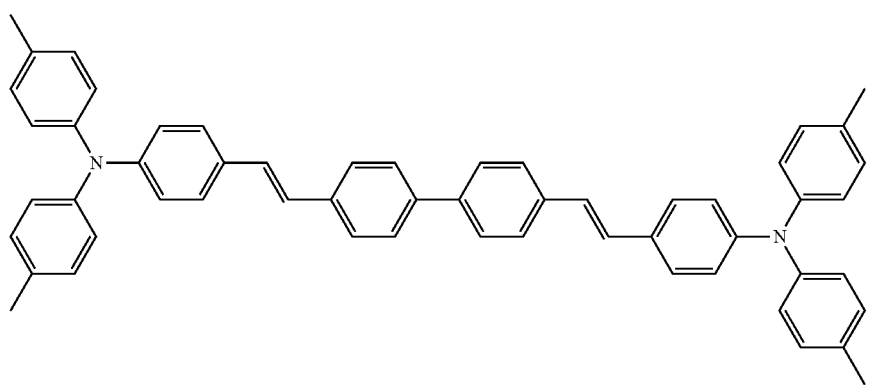

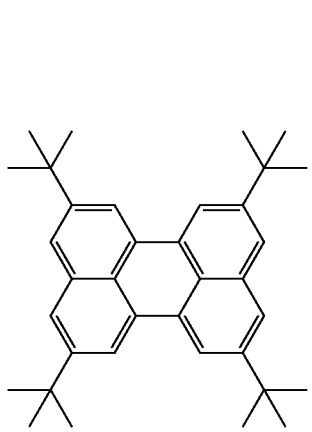
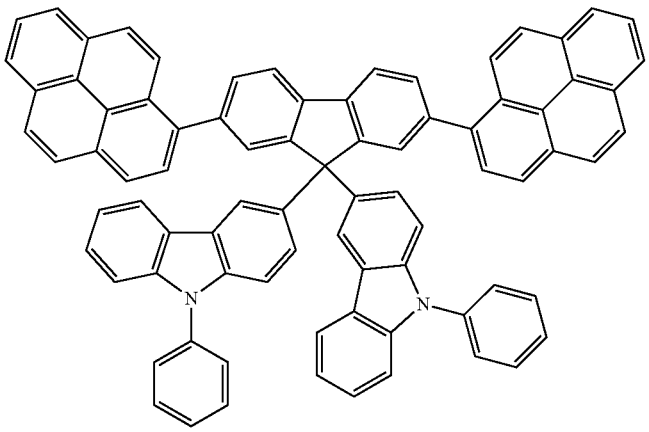
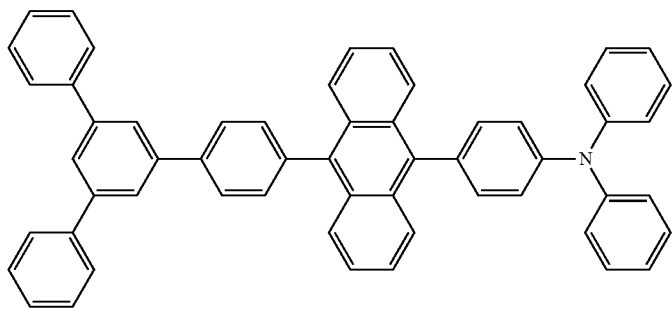
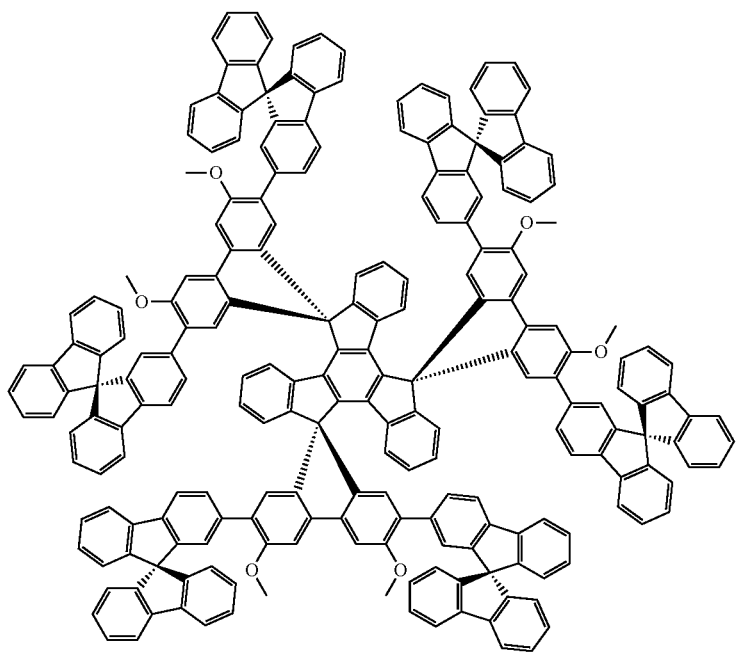

-continued
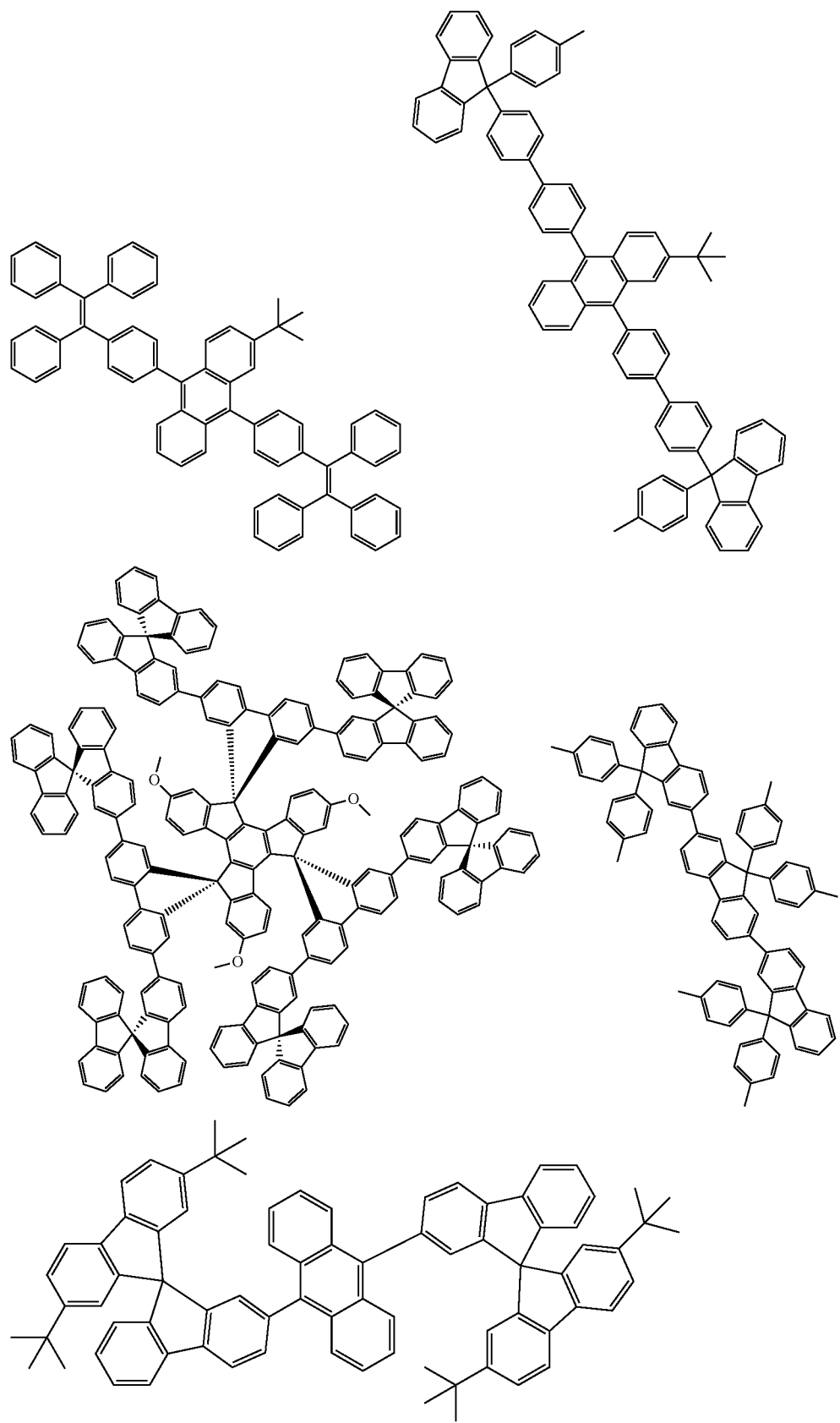

-continued
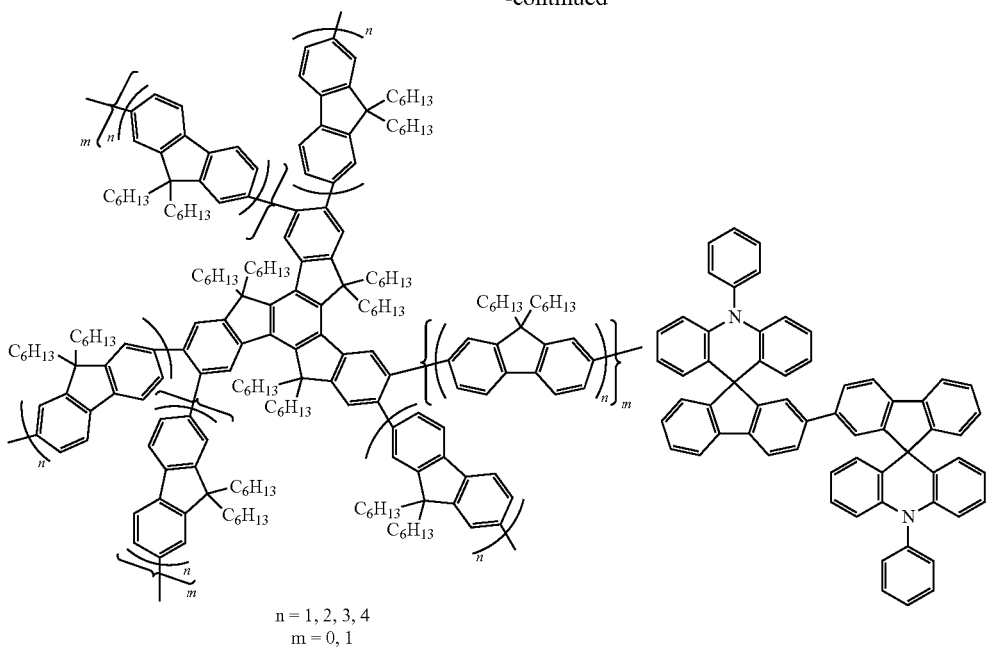
n = 1, 2, 3, 4
m = 0, 1
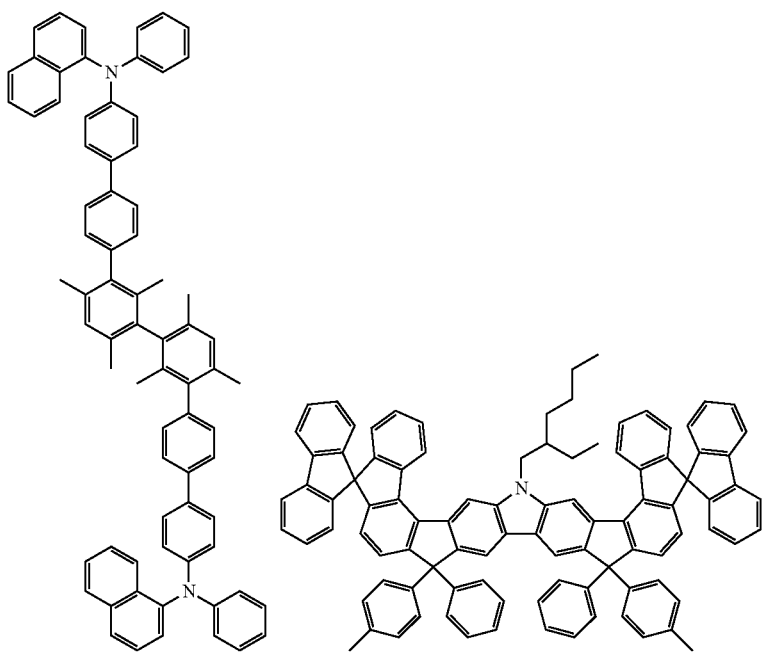

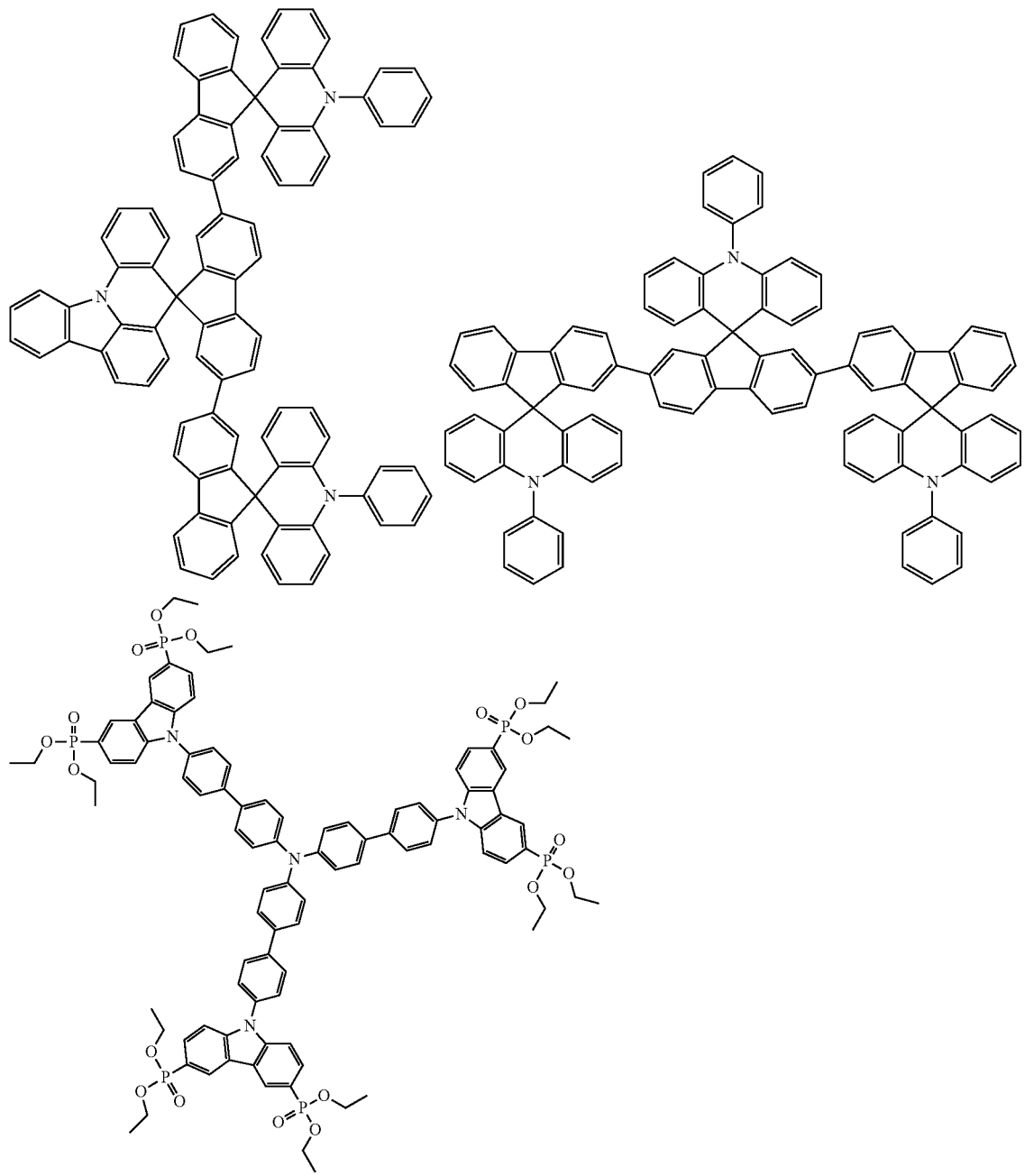
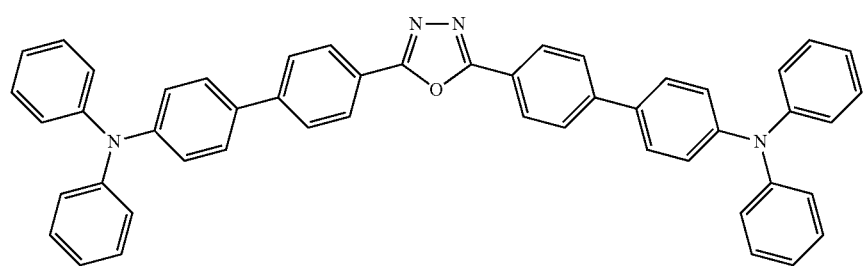

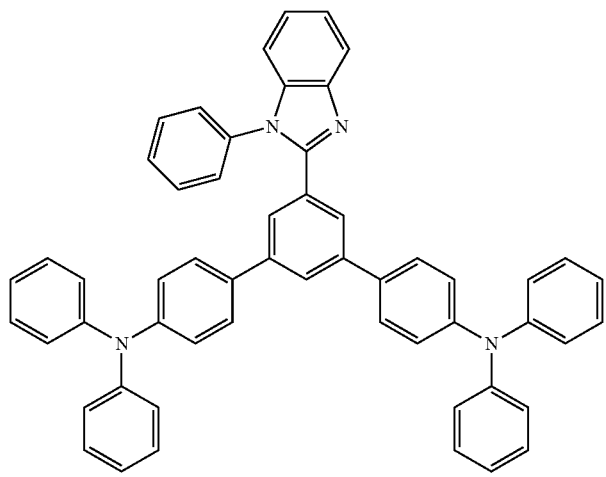
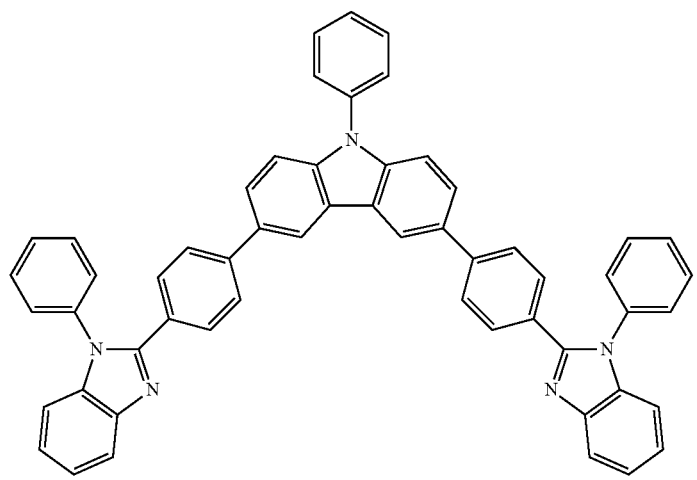
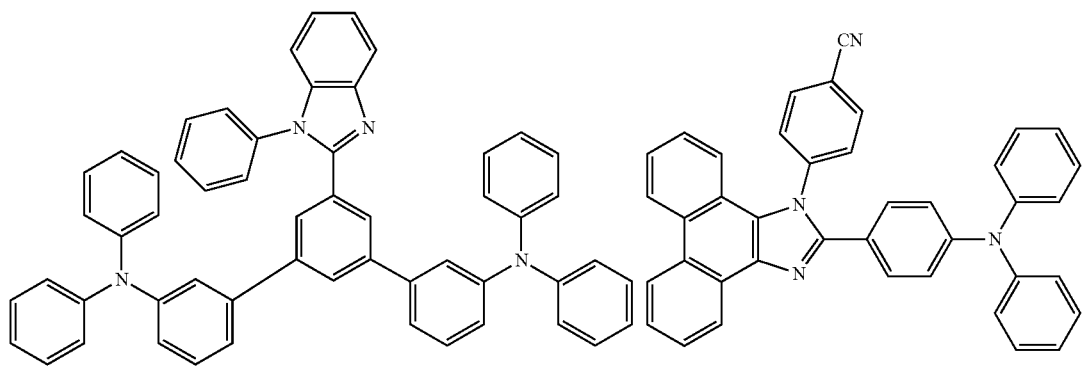

-continued
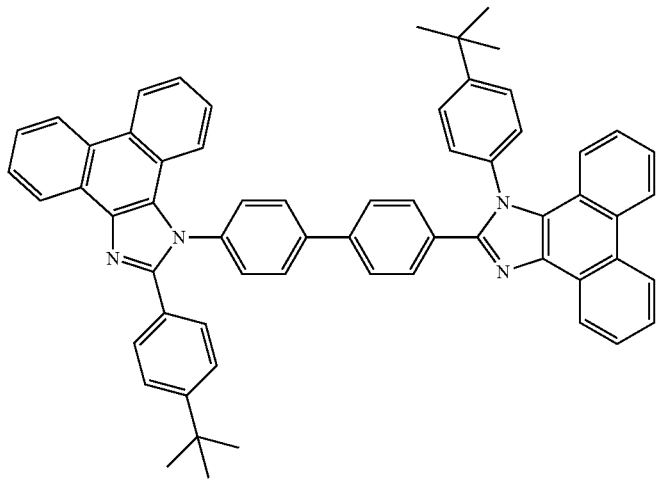
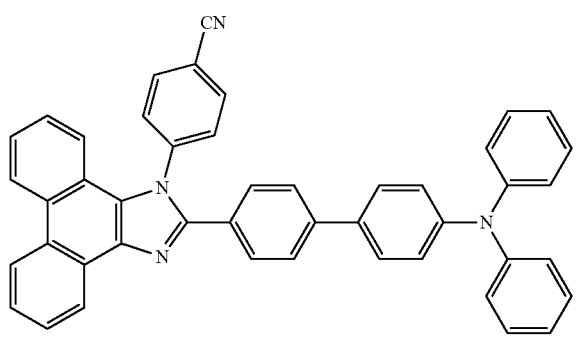
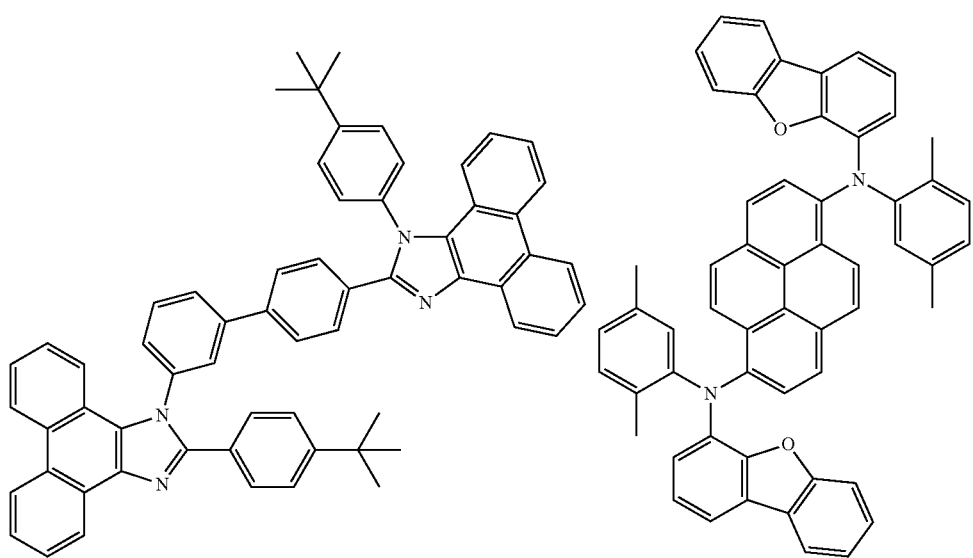

-continued
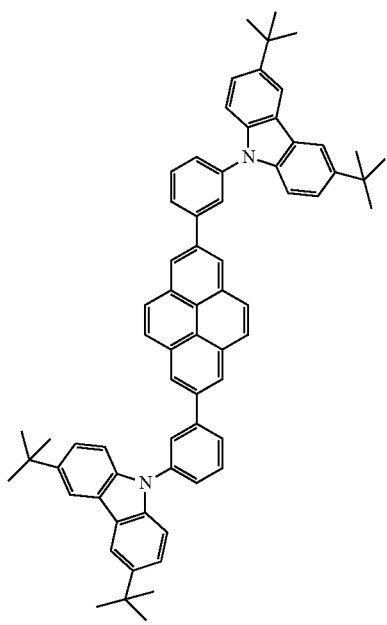
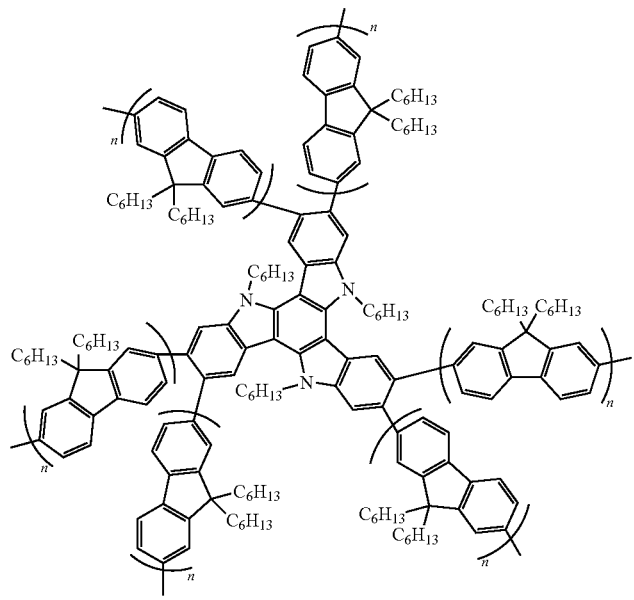
n = 0, 1, 2, 3
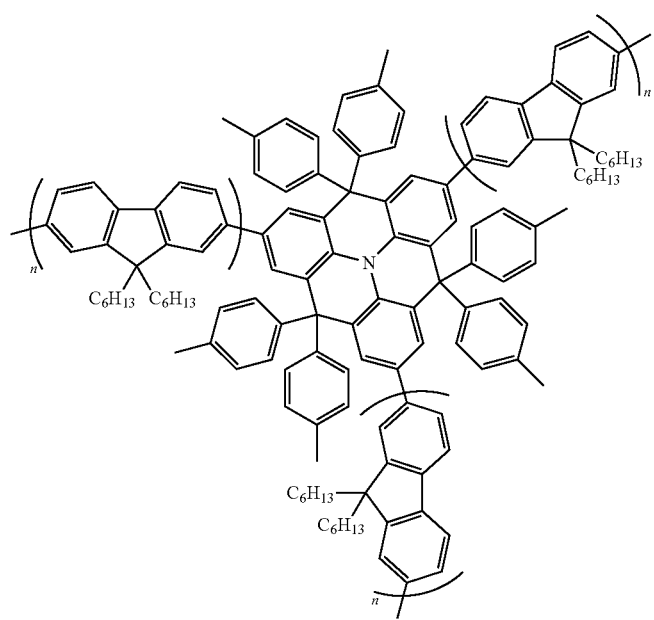
n = 2, 3

-continued
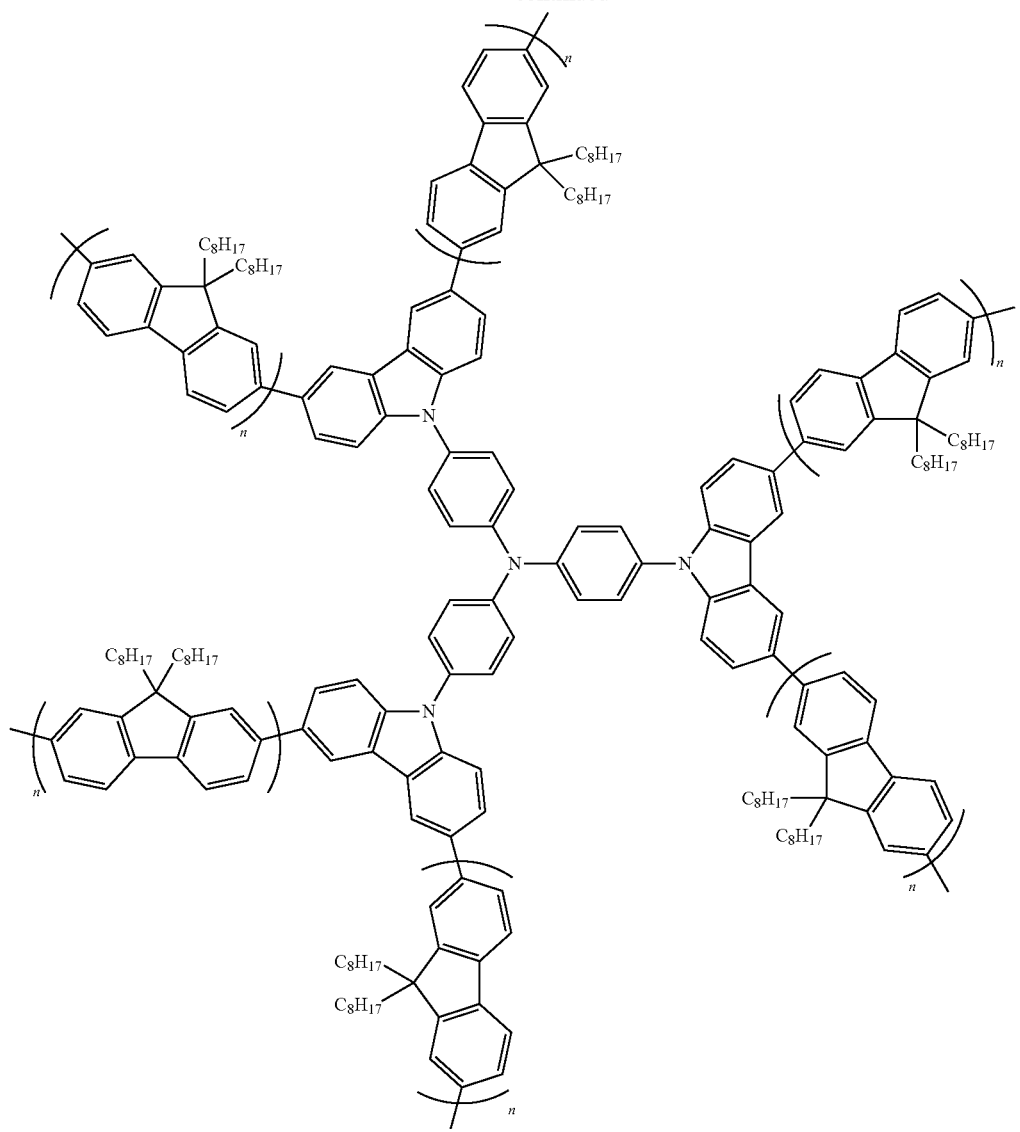
n = 1, 2, 3, 4

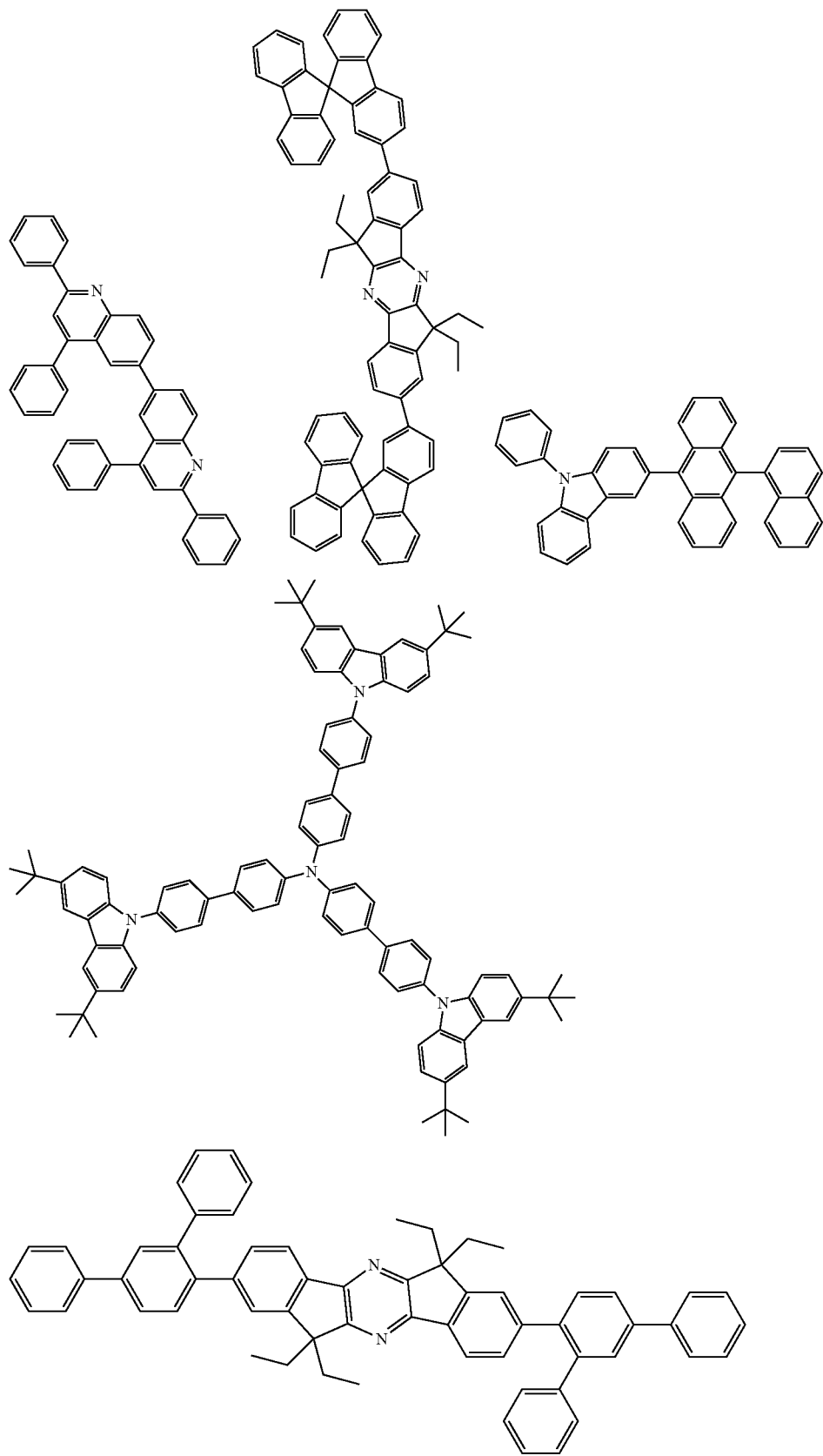

-continued
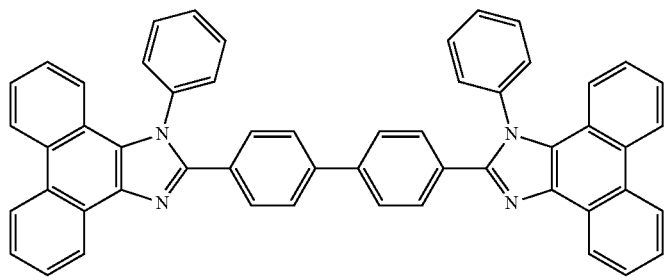
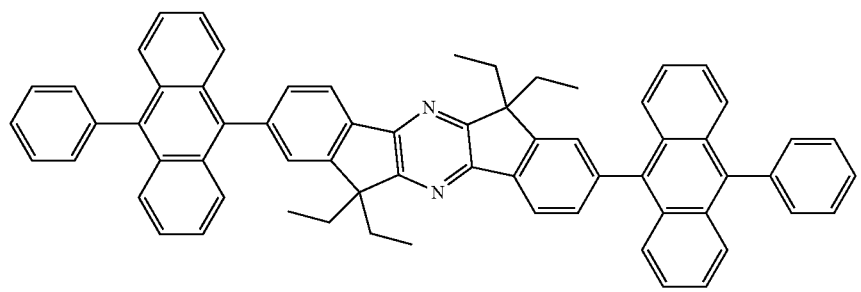
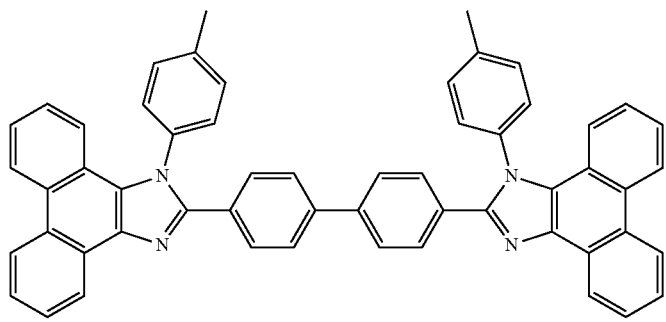
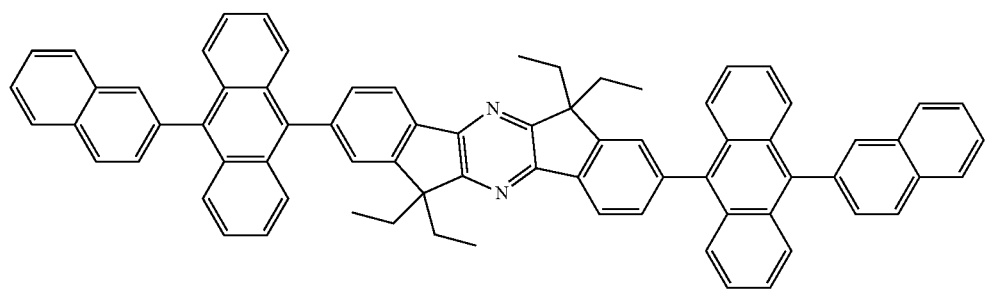
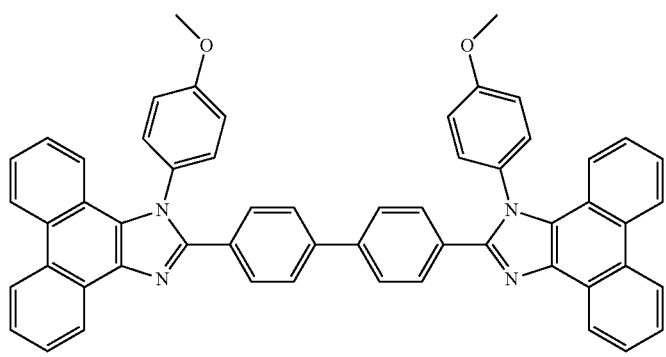

-continued
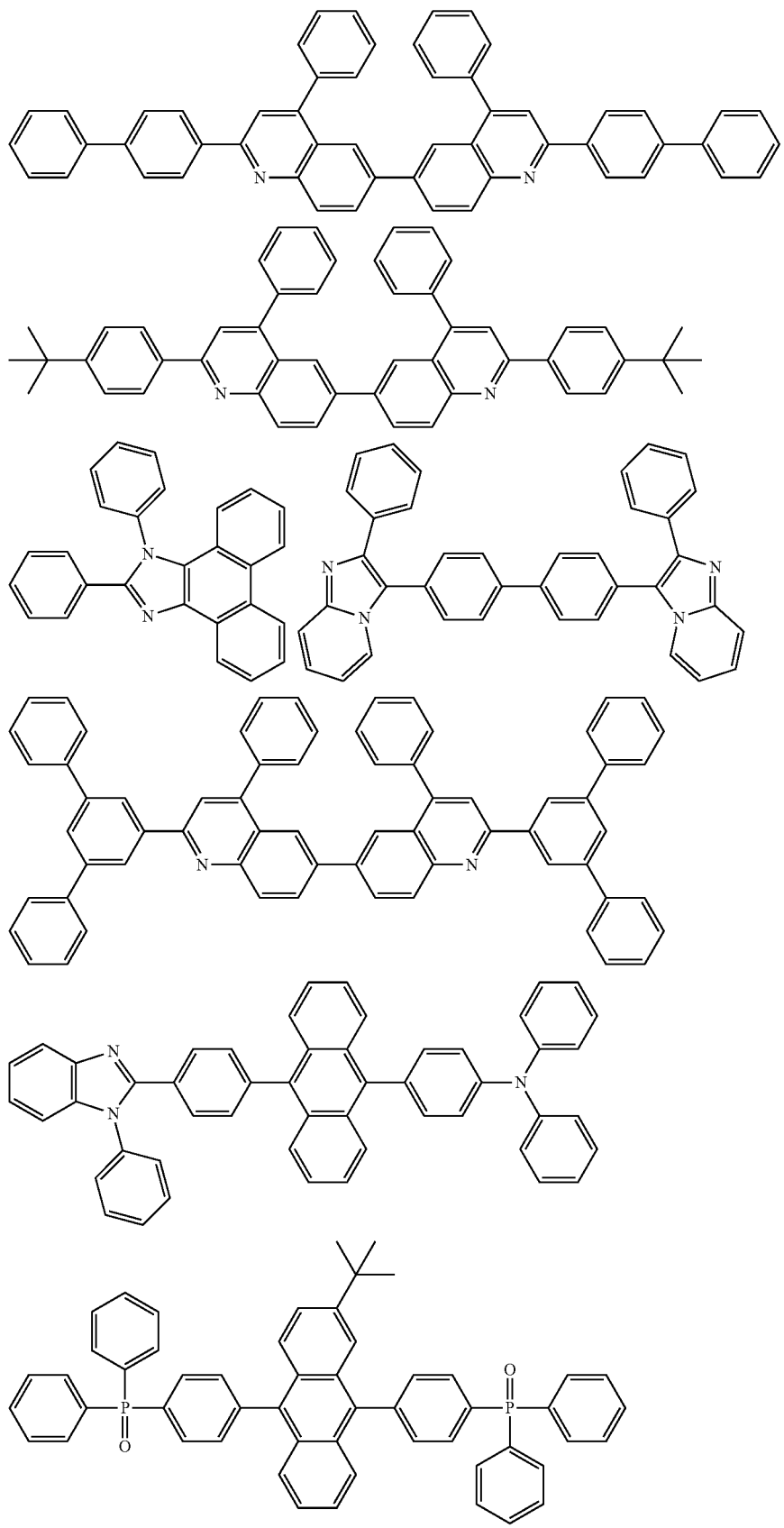

-continued
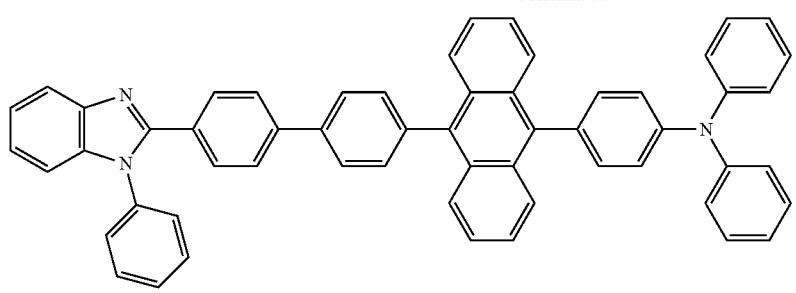
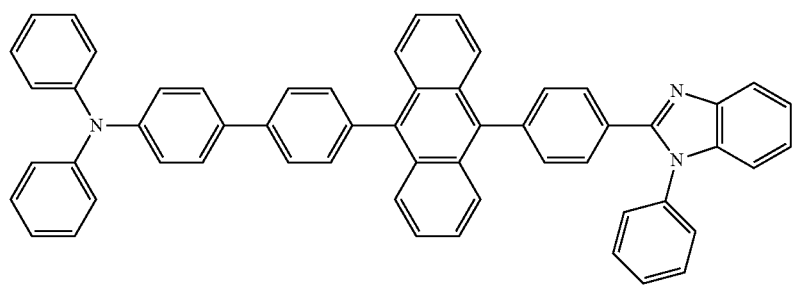
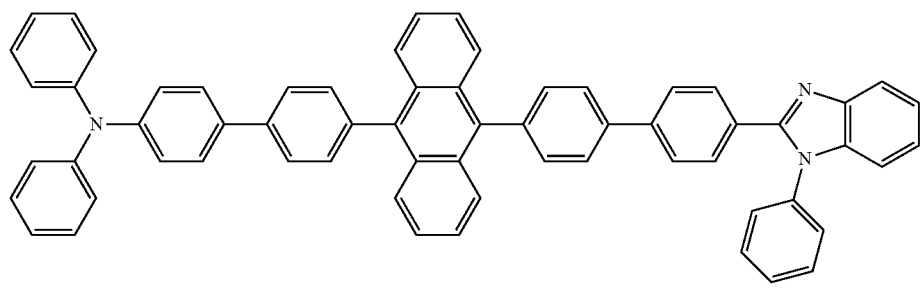
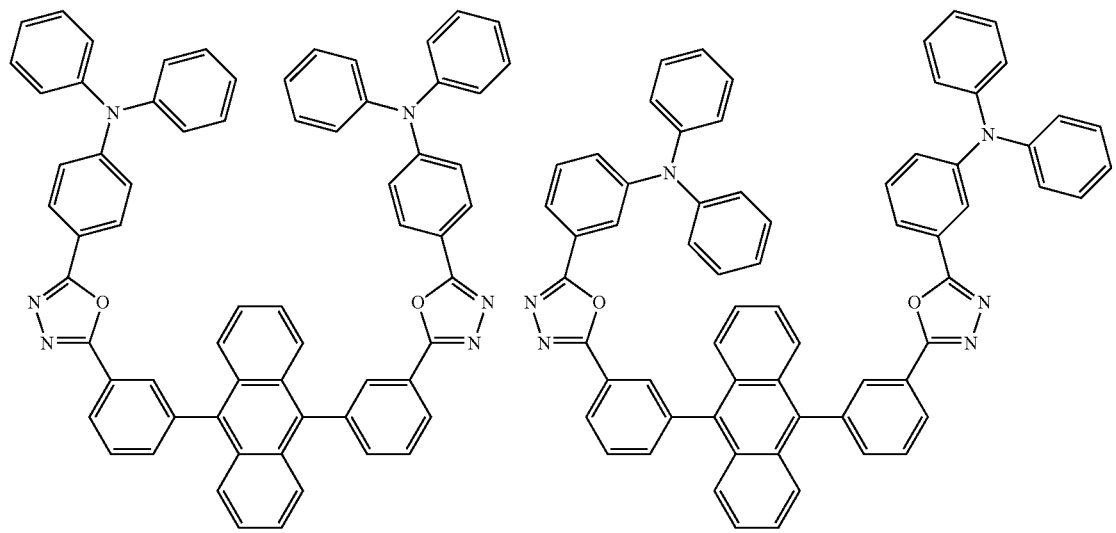

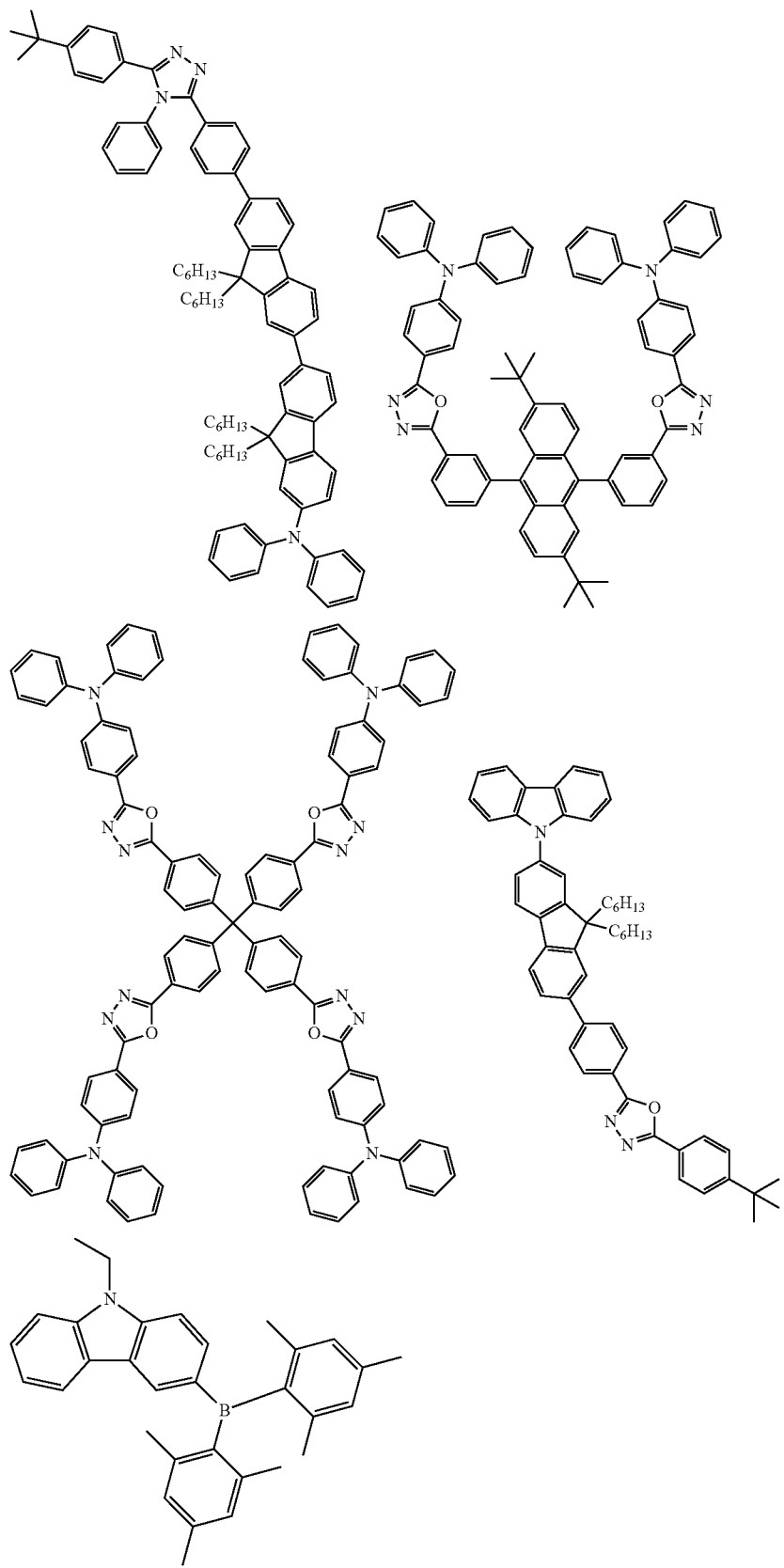

-continued
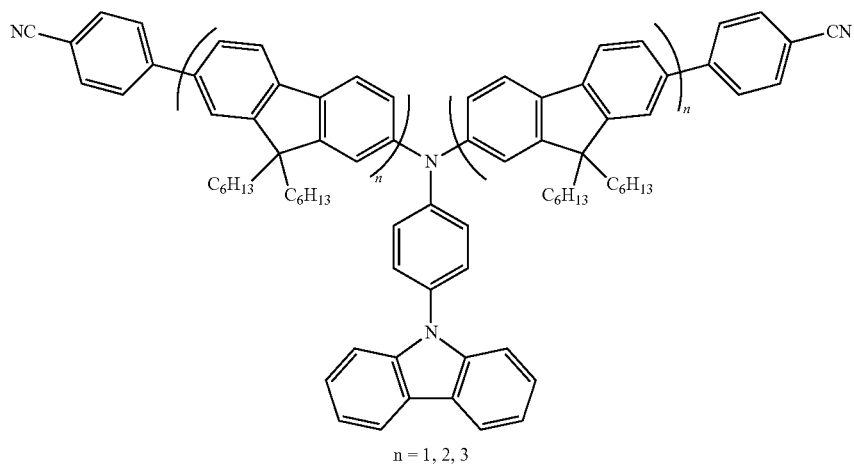
n = 1, 2, 3
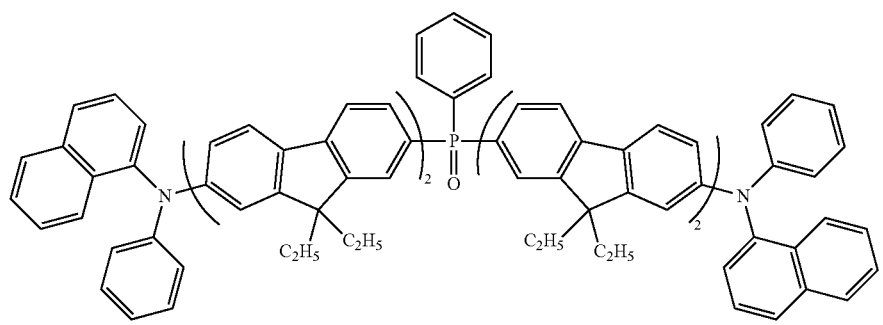
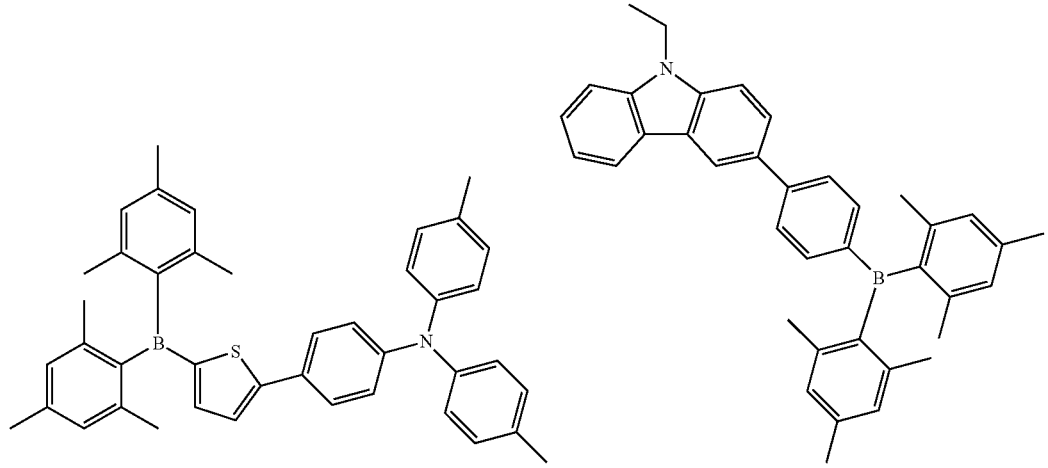
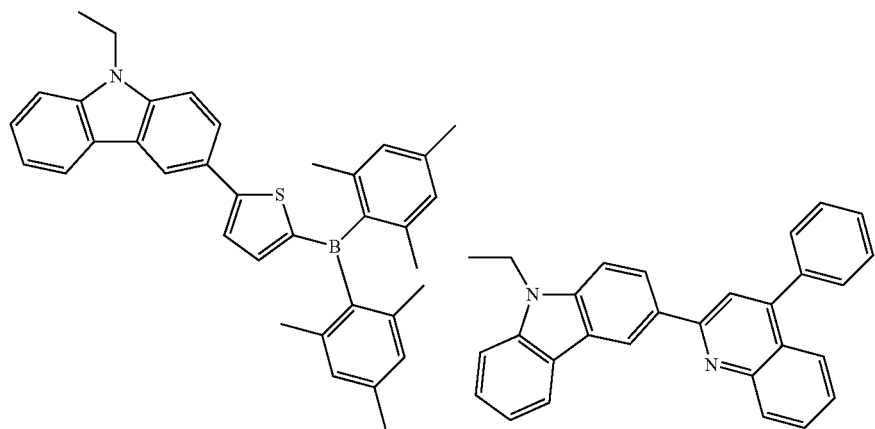

-continued
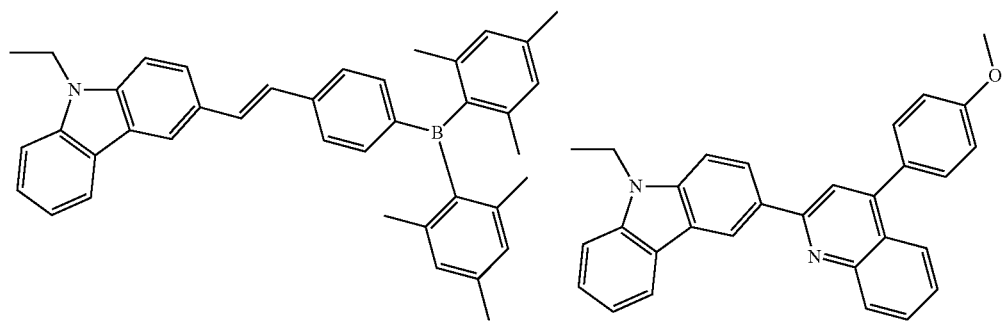
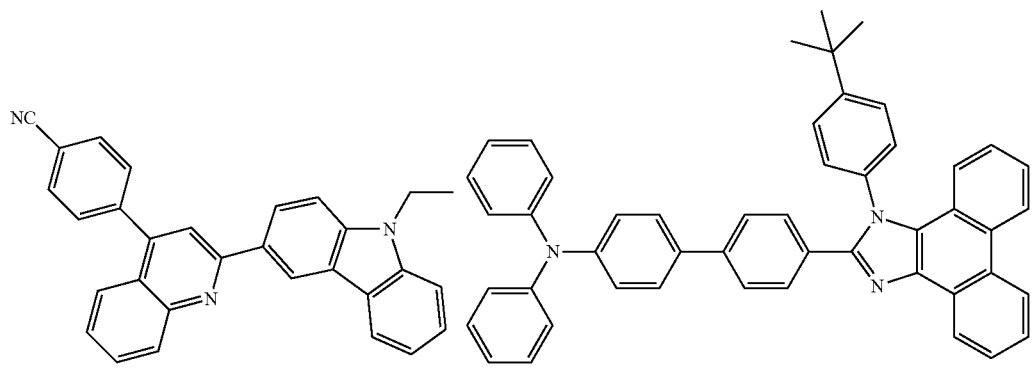
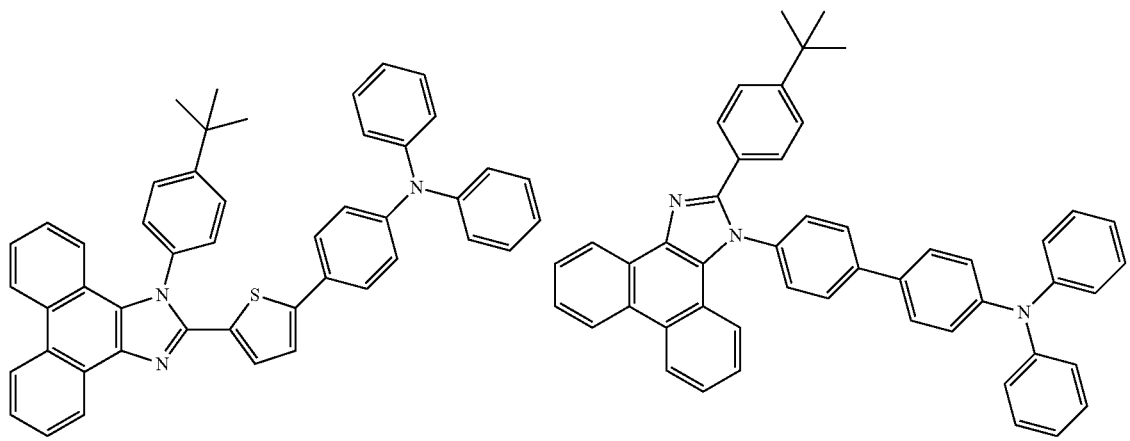
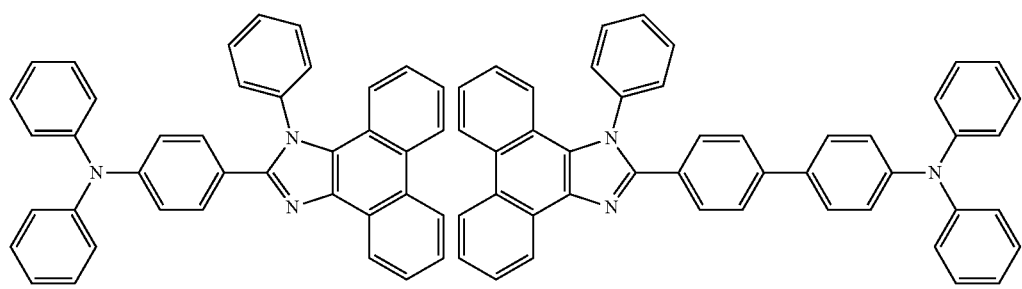

-continued
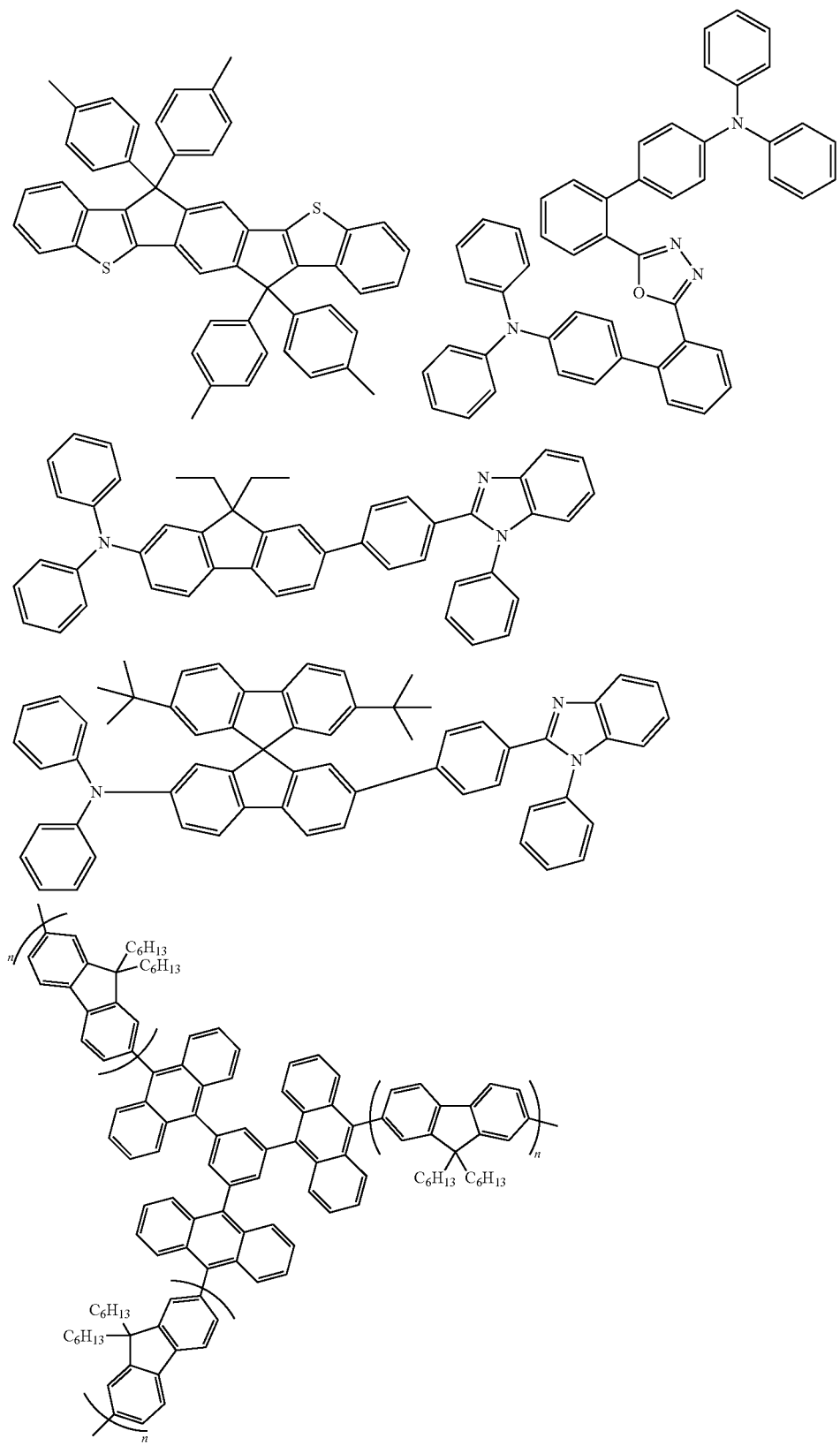
n = 1, 2, 3

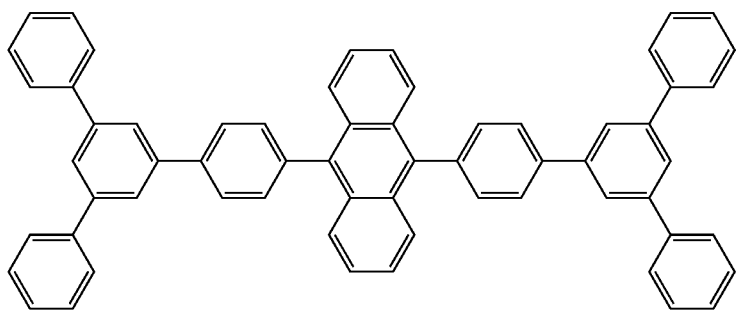
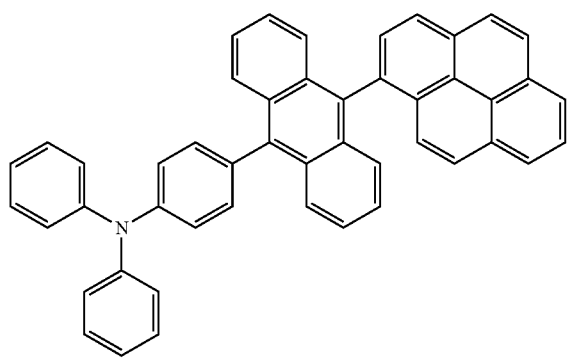
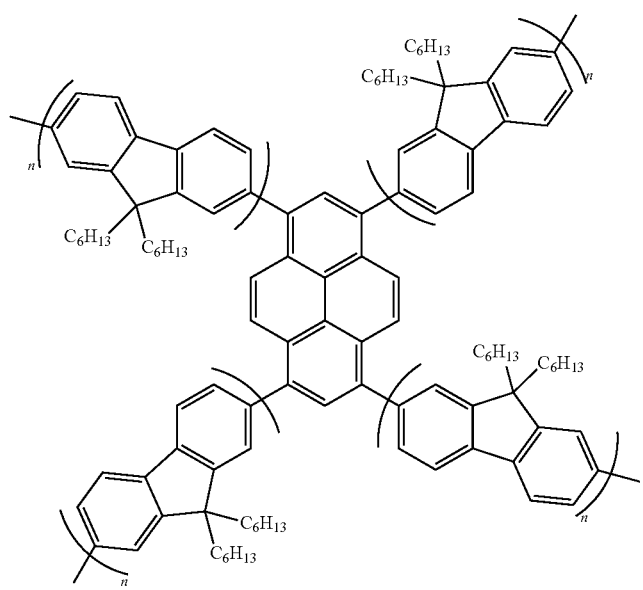
n = 1, 2, 3

In certain embodiments, the small FWHM emitter $S^B$ is an organic blue fluorescence emitter selected from the following group:
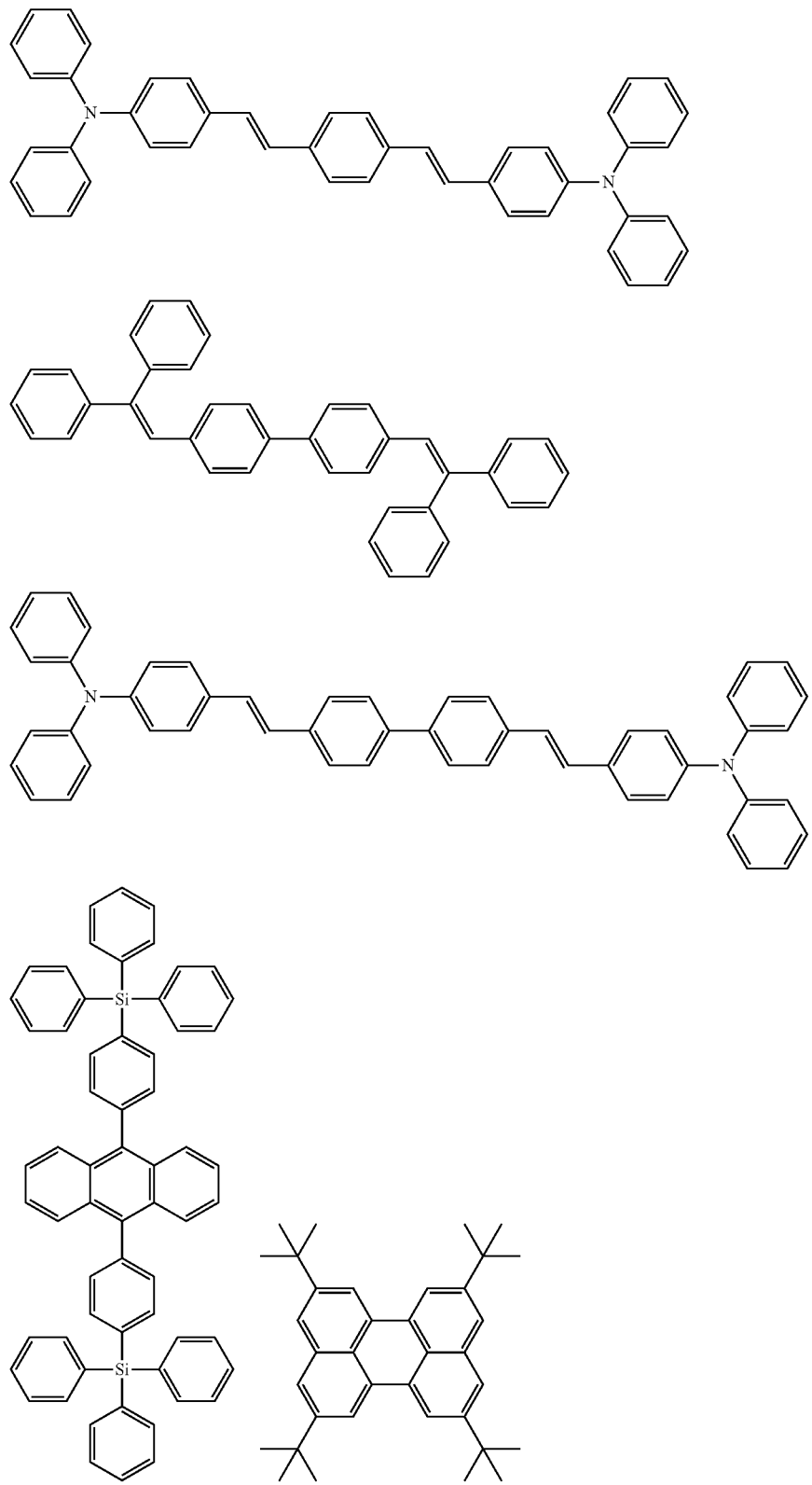

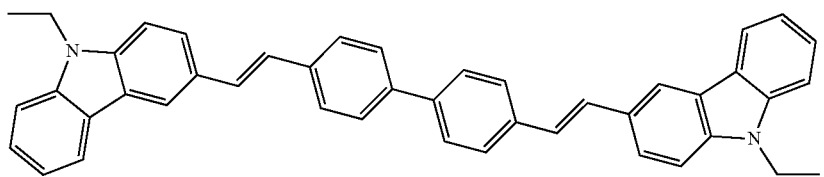
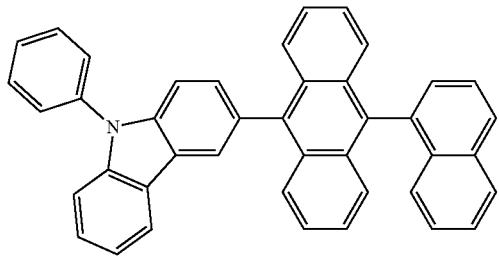
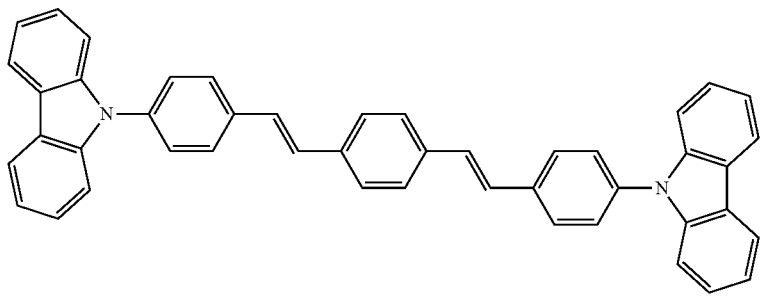
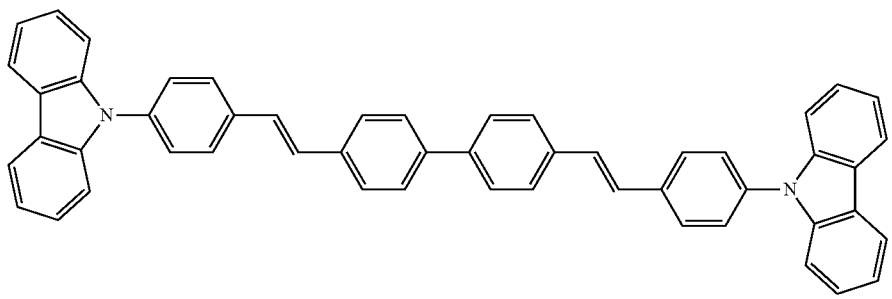
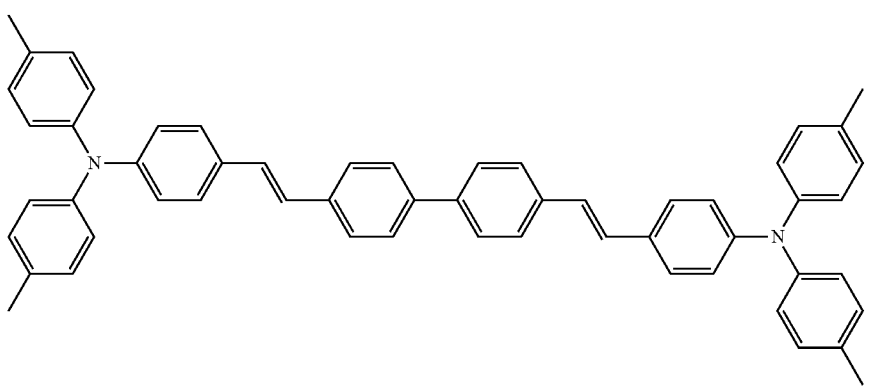

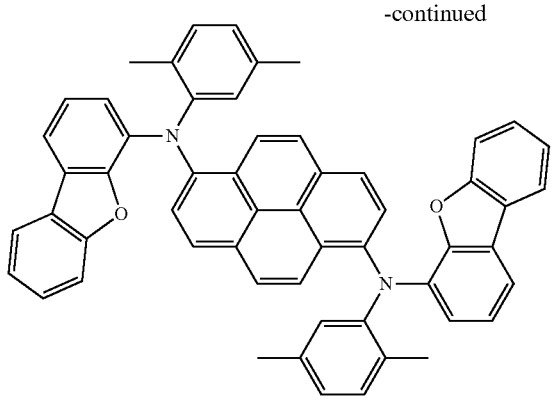
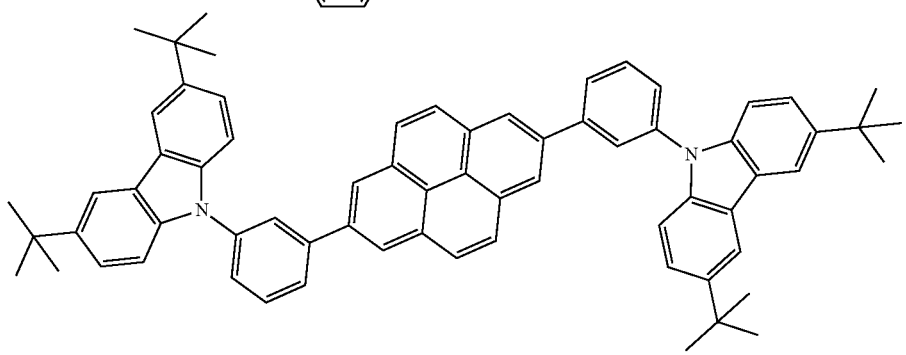
Device Wherein the Small FWHM Emitter $S^B$ is a Triplet-Triplet Annihilation (TTA) Fluorescence Emitter
In one embodiment of the invention, the small FWHM emitter $S^B$ is a blue organic triplet-triplet annihilation (TTA) emitter. In one embodiment, the small FWHM emitter $S^B$ is a blue organic TTA emitter selected from the following group:
-continued
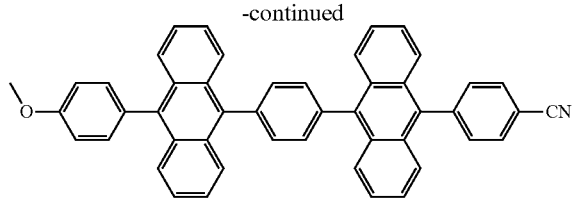
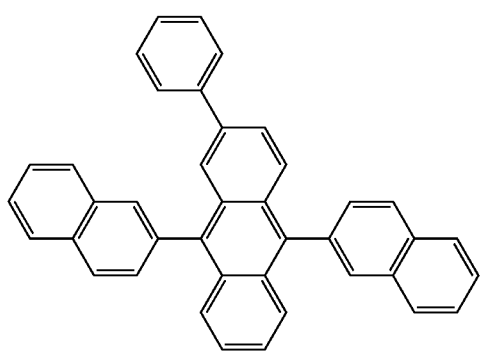
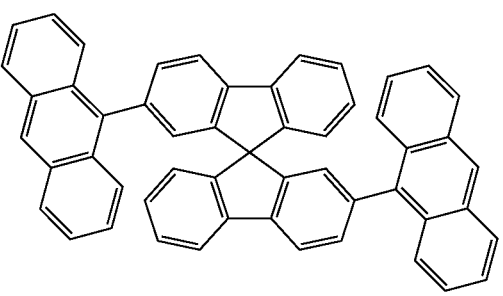
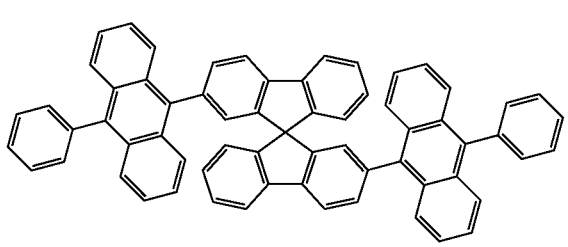
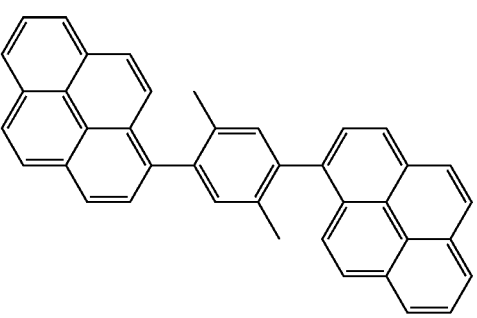

-continued

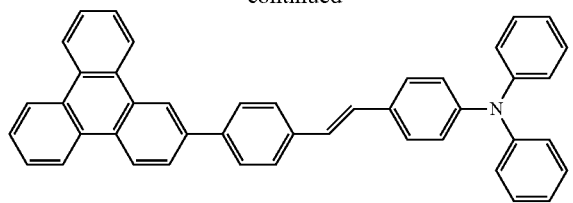

Device Wherein the Small FWHM Emitter $S^B$ is a Near-Range-Charge-Transfer (NRCT) Emitter In one embodiment of the invention, the small FWHM emitter $S^B$ is a near-range-charge-transfer (NRCT) emitter. According to the invention, a NRCT emitter shows a delayed component in the time-resolved photoluminescence spectrum and exhibits a near-range HOMO-LUMO separation as described by Hatakeyama et al. (Advanced Materials, 2016, 28(14):2777-2781, DOI: 10.1002/adma.201505491). In some embodiments, the NRCT emitter is a TADF material.

In one embodiment, the small FWHM emitter $S^B$ is a blue boron containing NRCT emitter.

In a preferred embodiment, the small FWHM emitter $S^B$ comprises or consists of a polycyclic aromatic compound.

In a preferred embodiment, the small FWHM emitter $S^B$ comprises or consists of a polycyclic aromatic compound according to formula (1) or (2) or a specific example described in US-A 2015/236274. US-A 2015/236274 also describes examples for synthesis of such compounds.

In one embodiment, the small FWHM emitter $S^B$ comprises or consists of a structure according to Formula 1:

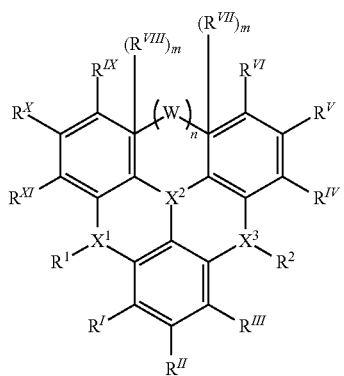

Formula I wherein
n is 0 or 1.
m=1−n.
$X^1$ is N or B.
$X^2$ is N or B.
$X^3$ is N or B.
W is selected from the group consisting of $Si(R^3)_2$, $C(R^3)_2$ and $BR^3$.
each of $R^1$, $R^2$ and $R^3$ is independently from each other selected from the group consisting of:
$C_1$-$C_5$-alkyl, which is optionally substituted with one or more substituents $R^6$;
$C_6$-$C_{60}$-aryl, which is optionally substituted with one or more substituents $R^6$; and
$C_3$-$C_{57}$-heteroaryl, which is optionally substituted with one or more substituents $R^6$;

each of $R^I$, $R^{II}$, $R^{III}$, $R^{IV}$, $R^V$, $R^{VI}$, $R^{VII}$, $R^{VIII}$, $R^{IX}$, $R^X$, and $R^{XI}$ is independently from another selected from the group consisting of: hydrogen, deuterium, $N(R^5)_2$, $OR^5$, $Si(R^5)_3$, $B(OR^5)_2$, $OSO_2R^5$, $CF_3$, CN, halogen,
$C_1$-$C_{40}$-alkyl, which is optionally substituted with one or more substituents $R^5$ and wherein one or more non-adjacent $CH_2$-groups are each optionally substituted by $R^5C=CR^5$, $C\equiv C$, $Si(R^5)_2$, $Ge(R^5)_2$, $Sn(R^5)_2$, C=O, C=S, C=Se, $C=NR^5$, $P(=O)(R^5)$, SO, $SO_2$, $NR^5$, O, S or $CONR^5$;
$C_1$-$C_{40}$-alkoxy, which is optionally substituted with one or more substituents $R^5$ and wherein one or more non-adjacent $CH_2$-groups are each optionally substituted by $R^5C=CR^5$, $C\equiv C$, $Si(R^5)_2$, $Ge(R^5)_2$, $Sn(R^5)_2$, C=O, C=S, C=Se, $C=NR^5$, $P(=O)(R^5)$, SO, $SO_2$, $NR^5$, O, S or $CONR^5$;
$C_1$-$C_{40}$-thioalkoxy, which is optionally substituted with one or more substituents $R^5$ and wherein one or more non-adjacent $CH_2$-groups are each optionally substituted by $R^5C=CR^5$, $C\equiv C$, $Si(R^5)_2$, $Ge(R^5)_2$, $Sn(R^5)_2$, C=O, C=S, C=Se, $C=NR^5$, $P(=O)(R^5)$, SO, $SO_2$, $NR^5$, O, S or $CONR^5$;
$C_2$-$C_{40}$-alkenyl, which is optionally substituted with one or more substituents $R^5$ and wherein one or more non-adjacent $CH_2$-groups are each optionally substituted by $R^5C=CR^5$, $C\equiv C$, $Si(R^5)_2$, $Ge(R^5)_2$, $Sn(R^5)_2$, C=O, C=S, C=Se, $C=NR^5$, $P(=O)(R^5)$, SO, $SO_2$, $NR^5$, O, S or $CONR^5$;
$C_2$-$C_{40}$-alkynyl, which is optionally substituted with one or more substituents $R^5$ and wherein one or more non-adjacent $CH_2$-groups are each optionally substituted by $R^5C=CR^5$, $C\equiv C$, $Si(R^5)_2$, $Ge(R^5)_2$, $Sn(R^5)_2$, C=O, C=S, C=Se, $C=NR^5$, $P(=O)(R^5)$, SO, $SO_2$, $NR^5$, O, S or $CONR^5$;
$C_2$-$C_{60}$-aryl, which is optionally substituted with one or more substituents $R^5$; and
$C_3$-$C_{57}$-heteroaryl, which is optionally substituted with one or more substituents $R^5$.

$R^5$ is at each occurrence independently from another selected from the group consisting of: hydrogen, deuterium, OPh, $CF_3$, CN, F,
$C_1$-$C_5$-alkyl, wherein optionally one or more hydrogen atoms are independently from each other substituted by deuterium, CN, $CF_3$, or F;
$C_1$-$C_5$-alkoxy, wherein optionally one or more hydrogen atoms are independently from each other substituted by deuterium, CN, $CF_3$, or F;
$C_1$-$C_5$-thioalkoxy, wherein optionally one or more hydrogen atoms are independently from each other substituted by deuterium, CN, $CF_3$, or F;
$C_2$-$C_5$-alkenyl, wherein optionally one or more hydrogen atoms are independently from each other substituted by deuterium, CN, $CF_3$, or F;
$C_2$-$C_5$-alkynyl, wherein optionally one or more hydrogen atoms are independently from each other substituted by deuterium, CN, $CF_3$, or F;
$C_6$-$C_{18}$-aryl, which is optionally substituted with one or more $C_1$-$C_5$-alkyl substituents;
$C_3$-$C_{17}$-heteroaryl, which is optionally substituted with one or more $C_1$-$C_5$-alkyl substituents;
$N(C_6$-$C_{18}$-aryl$)_2$,
$N(C_3$-$C_{17}$-heteroaryl$)_2$; and
$N(C_3$-$C_{17}$-heteroaryl)($C_6$-$C_{18}$-aryl).

$R^6$ is at each occurrence independently from another selected from the group consisting of hydrogen, deuterium, OPh, $CF_3$, CN, F,
$C_1$-$C_5$-alkyl, wherein optionally one or more hydrogen atoms are independently from each other substituted by deuterium, CN, $CF_3$, or F;

$C_1$-$C_5$-alkoxy, wherein optionally one or more hydrogen atoms are independently from each other substituted by deuterium, CN, $CF_3$, or F;

$C_1$-$C_5$-thioalkoxy, wherein optionally one or more hydrogen atoms are independently from each other substituted by deuterium, CN, $CF_3$, or F;

$C_2$-$C_5$-alkenyl, wherein optionally one or more hydrogen atoms are independently from each other substituted by deuterium, CN, $CF_3$, or F;

$C_2$-$C_5$-alkynyl, wherein optionally one or more hydrogen atoms are independently from each other substituted by deuterium, CN, $CF_3$, or F;

$C_6$-$C_{18}$-aryl, which is optionally substituted with one or more $C_1$-$C_5$-alkyl substituents;

$C_3$-$C_{17}$-heteroaryl, which is optionally substituted with one or more $C_1$-$C_5$-alkyl substituents;

$N(C_6$-$C_{18}$-aryl$)_2$, $N(C_3$-$C_{17}$-heteroaryl$)_2$; and $N(C_3$-$C_{17}$-heteroaryl$)(C_6$-$C_{18}$-aryl$)$.

According to a preferred embodiment, two or more of the substituents selected from the group consisting of $R^I$, $R^{II}$, $R^{III}$, $R^{IV}$, $R^V$, $R^{VI}$, $R^{VII}$, $R^{VIII}$, $R^{IX}$, $R^X$, and $R^{XI}$ that are positioned adjacent to another may each form a mono- or polycyclic, aliphatic, aromatic and/or benzo-fused ring system with another.

According to a preferred embodiment, at least one of $X^1$, $X^2$ and $X^3$ is B and at least one of $X^1$, $X^2$ and $X^3$ is N.

According to a preferred embodiment of the invention, at least one substituent selected from the group consisting of $R^I$, $R^{II}$, $R^{III}$, $R^{IV}$, $R^V$, $R^{VI}$, $R^{VII}$, $R^{VIII}$, $R^{IX}$, $R^X$, and $R^{XI}$ optionally forms a mono- or polycyclic, aliphatic, aromatic and/or benzo-fused ring system with one or more substituents of the same group that is/are positioned adjacent to the at least one substituent.

According to a preferred embodiment of the invention, at least one of $X^1$, $X^2$ and $X^3$ is B and at least one of $X^1$, $X^2$ and $X^3$ is N.

In one embodiment, the small FWHM emitter $S^B$ comprises or consists of a structure according to Formula 1 and $X^1$ and $X^3$ each are N and $X^2$ is B:

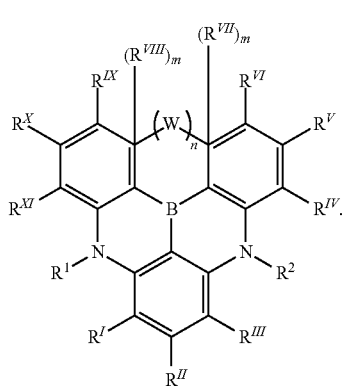

Formula Ia

In one embodiment, the small FWHM emitter $S^B$ comprises or consists of a structure according to Formula 1 and $X^1$ and $X^3$ each are B and $X^2$ is N:

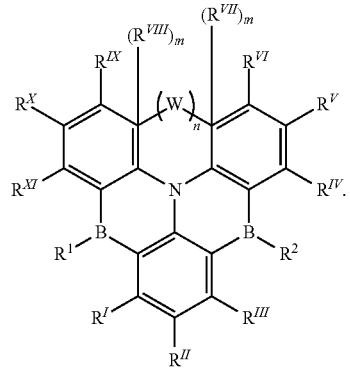

Formula Ib

In one embodiment, the small FWHM emitter $S^B$ comprises or consists of a structure according to Formula 1 and n=0.

In one embodiment, each of $R^1$ and $R^2$ is each independently from each other selected from the group consisting of $C_1$-$C_5$-alkyl, which is optionally substituted with one or more substituents $R^6$;

$C_6$-$C_{30}$-aryl, which is optionally substituted with one or more substituents $R^6$; and $C_3$-$C_{30}$-heteroaryl, which is optionally substituted with one or more substituents $R^6$.

In one embodiment, $R^1$ and $R^2$ is each independently from each other selected from the group consisting of Me, $^iPr$, $^tBu$, CN, $CF_3$, Ph, which is optionally substituted with one or more substituents independently from each other selected from the group consisting of Me, $^iPr$, $^tBu$, CN, $CF_3$, and Ph;

pyridinyl, which is optionally substituted with one or more substituents independently from each other selected from the group consisting of Me, $^iPr$, $^tBu$, CN, $CF_3$, and Ph;

pyrimidinyl, which is optionally substituted with one or more substituents independently from each other selected from the group consisting of Me, $^iPr$, $^tBu$, CN, $CF_3$, and Ph; and triazinyl, which is optionally substituted with one or more substituents independently from each other selected from the group consisting of Me, $^iPr$, $^tBu$, CN, $CF_3$, and Ph.

In one embodiment, each of $R^I$, $R^{II}$, $R^{III}$, $R^{IV}$, $R^V$, $R^{VI}$, $R^{VII}$, $R^{VIII}$, $R^{IX}$, $R^X$, and $R^{XI}$ is independently from another selected from the group consisting of: hydrogen, deuterium, halogen, Me, $^iPr$, $^tBu$, CN, $CF_3$, Ph, which is optionally substituted with one or more substituents independently from each other selected from the group consisting of Me, $^iPr$, $^tBu$, CN, $CF_3$, and Ph;

pyridinyl, which is optionally substituted with one or more substituents independently from each other selected from the group consisting of Me, $^iPr$, $^tBu$, CN, $CF_3$, and Ph;

pyrimidinyl, which is optionally substituted with one or more substituents independently from each other selected from the group consisting of Me, $^iPr$, $^tBu$, CN, $CF_3$, and Ph;

carbazolyl, which is optionally substituted with one or more substituents independently from each other selected from the group consisting of Me, $^iPr$, $^tBu$, CN, $CF_3$, and Ph;

triazinyl, which is optionally substituted with one or more substituents independently from each other selected from the group consisting of Me, $^iPr$, $^tBu$, CN, $CF_3$, and Ph; and $N(Ph)_2$.

In one embodiment, each of $R^I$, $R^{II}$, $R^{III}$, $R^{IV}$, $R^V$, $R^{VI}$, $R^{VII}$, $R^{VIII}$, $R^{IX}$, $R^X$, and $R^{XI}$ is independently from another selected from the group consisting of: hydrogen, deuterium, halogen, Me, $^i$Pr, $^t$Bu, CN, CF$_3$, Ph, which is optionally substituted with one or more substituents independently from each other selected from the group consisting of Me, $^i$Pr, $^t$Bu, CN, CF$_3$, and Ph;

pyridinyl, which is optionally substituted with one or more substituents independently from each other selected from the group consisting of Me, $^i$Pr, $^t$Bu, CN, CF$_3$, and Ph;

pyrimidinyl, which is optionally substituted with one or more substituents independently from each other selected from the group consisting of Me, $^i$Pr, $^t$Bu, CN, CF$_3$, and Ph;

carbazolyl, which is optionally substituted with one or more substituents independently from each other selected from the group consisting of Me, $^i$Pr, $^t$Bu, CN, CF$_3$, and Ph;

triazinyl, which is optionally substituted with one or more substituents independently from each other selected from the group consisting of Me, $^i$Pr, $^t$Bu, CN, CF$_3$, and Ph;

and N(Ph)$_2$; and $R^1$ and $R^2$ is each independently from each other selected from the group consisting of $C_1$-$C_5$-alkyl, which is optionally substituted with one or more substituents $R^6$;

$C_6$-$C_{30}$-aryl, which is optionally substituted with one or more substituents $R^6$; and $C_3$-$C_{30}$-heteroaryl, which is optionally substituted with one or more substituents $R^6$.

In one embodiment, the small FWHM emitter $S^B$ is a blue boron-containing NRCT emitter selected from the following group:

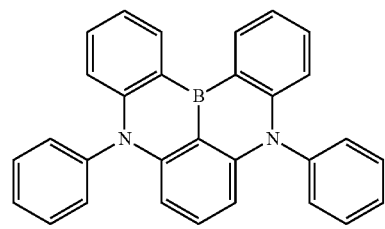

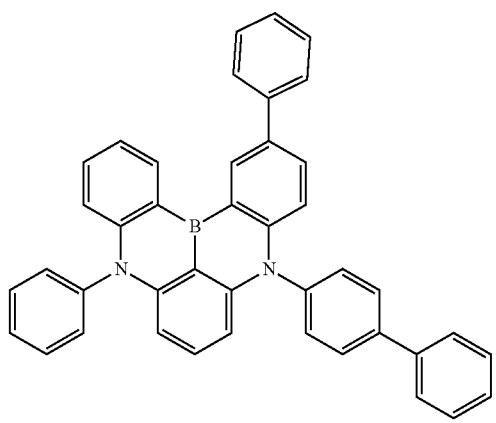

-continued

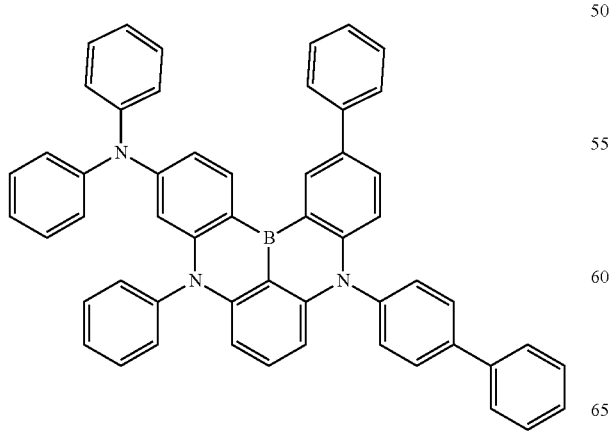

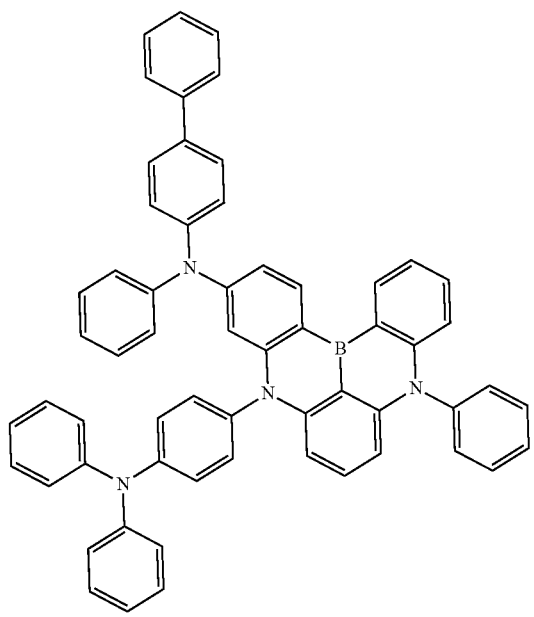

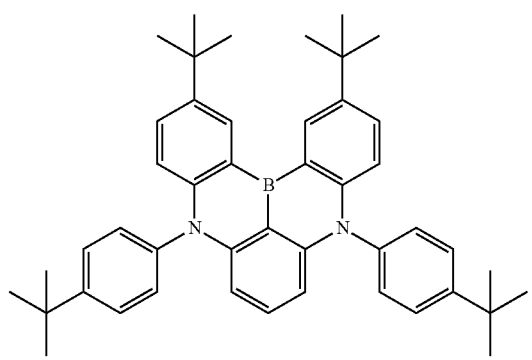

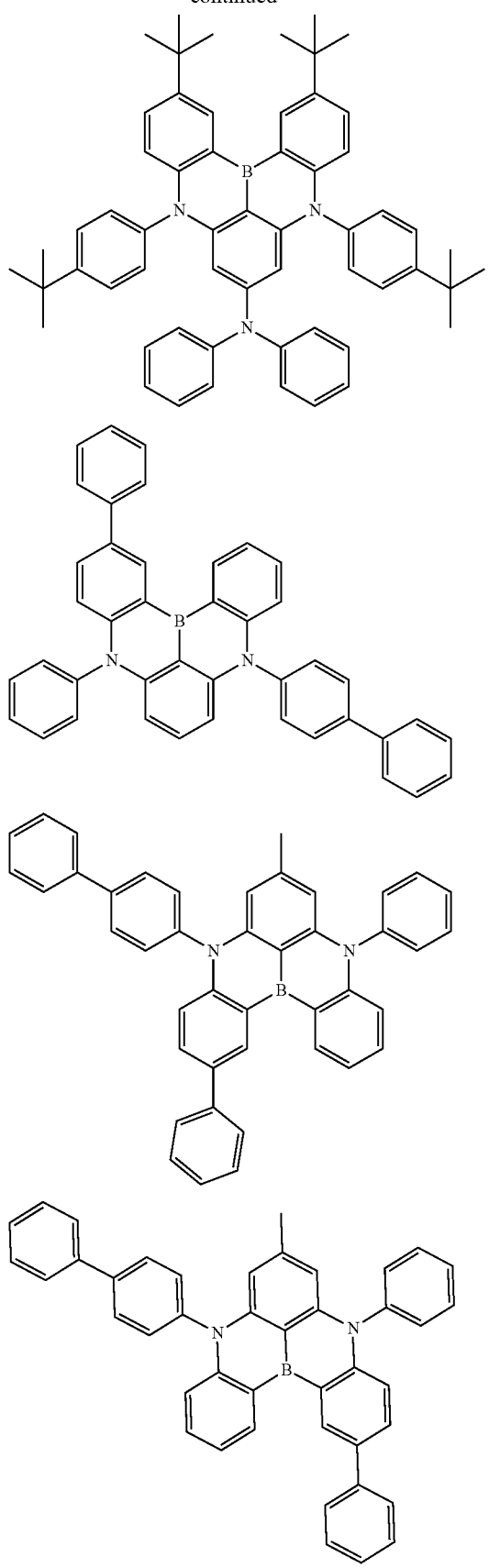
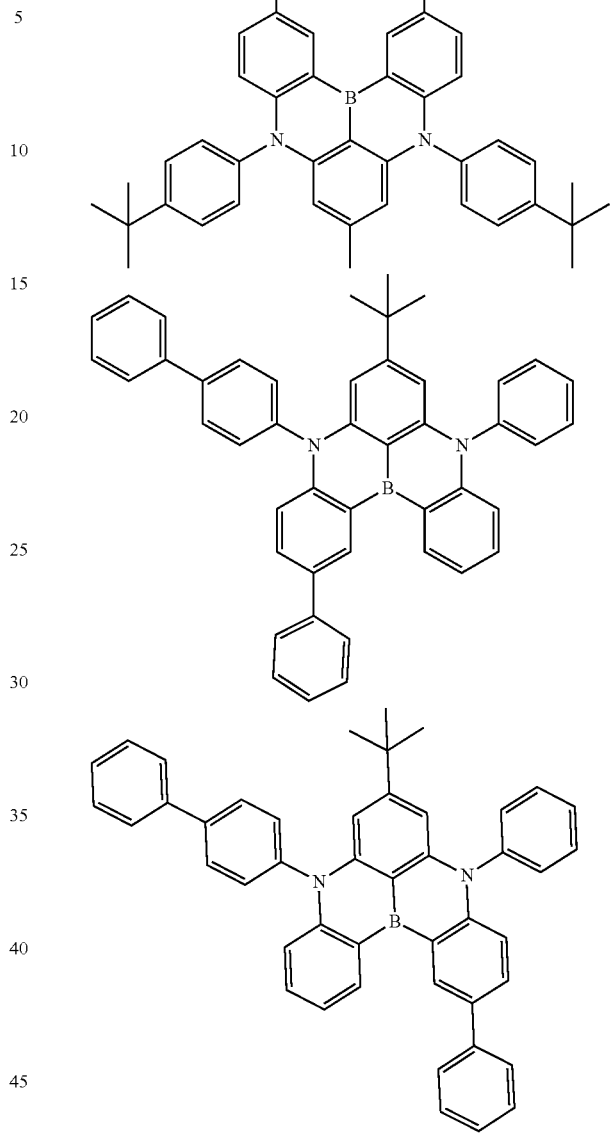

The person skilled in the art will notice that the light-emitting layer B will typically be incorporated in the organic electroluminescent device of the present invention. Preferably, such organic electroluminescent device comprises at least the following layers: at least one light-emitting layer B, at least one anode layer A and at least one cathode layer C.

Preferably, the anode layer A contains at least one component selected from the group consisting of indium tin oxide, indium zinc oxide, PbO, SnO, graphite, doped silicium, doped germanium, doped GaAs, doped polyaniline, doped polypyrrole, doped polythiophene, and mixtures of two or more thereof.

Preferably, the cathode layer C contains at least one component selected from the group consisting of Al, Au, Ag, Pt, Cu, Zn, Ni, Fe, Pb, In, W, Pd, LiF, Ca, Ba, Mg, and mixtures or alloys of two or more thereof.

Preferably, the light-emitting layer B is located between an anode layer A and a cathode layer C. Accordingly, the general set-up is preferably A-B-C. This does of course not exclude the presence of one or more optional further layers. These can be present at each side of A, of B and/or of C.

In a preferred embodiment, the organic electroluminescent device comprises at least the following layers:
A) an anode layer A containing at least one component selected from the group consisting of indium tin oxide, indium zinc oxide, PbO, SnO, graphite, doped silicium, doped germanium, doped GaAs, doped polyaniline, doped polypyrrole, doped polythiophene, and mixtures of two or more thereof;
B) the light-emitting layer B; and
C) a cathode layer C containing at least one component selected from the group consisting of Al, Au, Ag, Pt, Cu, Zn, Ni, Fe, Pb, In, W, Pd, LiF, Ca, Ba, Mg, and mixtures or alloys of two or more thereof,
wherein the light-emitting layer B is located between the anode layer A and the a cathode layer C.

In one embodiment, when the organic electroluminescent device is an OLED, it may optionally comprise the following layer structure:
A) an anode layer A, exemplarily comprising indium tin oxide (ITO);
HTL) a hole transport layer HTL;
B) a light-emitting layer B according to present invention as described herein;
ETL) an electron transport layer ETL; and
C) a cathode layer, exemplarily comprising Al, Ca and/or Mg.

Preferably, the order of the layers herein is A-HTL-B-ETL-C.

Furthermore, the organic electroluminescent device may optionally comprise one or more protective layers protecting the device from damaging exposure to harmful species in the environment including, exemplarily moisture, vapor and/or gases.

Preferably, the anode layer A is located on the surface of a substrate. The substrate may be formed by any material or composition of materials. Most frequently, glass slides are used as substrates. Alternatively, thin metal layers (e.g., copper, gold, silver or aluminum films) or plastic films or slides may be used. This may allow a higher degree of flexibility. The anode layer A is mostly composed of materials allowing to obtain an (essentially) transparent film. As at least one of both electrodes should be (essentially) transparent in order to allow light emission from the OLED, either the anode layer A or the cathode layer C transparent. Preferably, the anode layer A comprises a large content or even consists of transparent conductive oxides (TCOs).

Such anode layer A may exemplarily comprise indium tin oxide, aluminum zinc oxide, fluor tin oxide, indium zinc oxide, PbO, SnO, zirconium oxide, molybdenum oxide, vanadium oxide, wolfram oxide, graphite, doped Si, doped Ge, doped GaAs, doped polyaniline, doped polypyrrol and/or doped polythiophene.

Particularly preferably, the anode layer A (essentially) consists of indium tin oxide (ITO) (e.g., $(InO_3)_{0.9}(SnO_2)_{0.1}$). The roughness of the anode layer A caused by the transparent conductive oxides (TCOs) may be compensated by using a hole injection layer (HIL). Further, the HIL may facilitate the injection of quasi charge carriers (i.e., holes) in that the transport of the quasi charge carriers from the TCO to the hole transport layer (HTL) is facilitated. The hole injection layer (HIL) may comprise poly-3,4-ethylendioxy thiophene (PEDOT), polystyrene sulfonate (PSS), $MoO_2$, $V_2O_5$, CuPC or CuI, in particular a mixture of PEDOT and PSS. The hole injection layer (HIL) may also prevent the diffusion of metals from the anode layer A into the hole transport layer (HTL). The HIL may exemplarily comprise PEDOT:PSS (poly-3,4-ethylendioxy thiophene: polystyrene sulfonate), PEDOT (poly-3,4-ethylendioxy thiophene), mMTDATA (4,4',4''-tris[phenyl(m-tolyl)amino]triphenylamine), Spiro-TAD (2,2',7,7'-tetrakis(n,n-diphenylamino)-9,9'-spirobifluorene), DNTPD (N1,N1'-(biphenyl-4,4'-diyl)bis(N1-phenyl-N4,N4-di-m-tolylbenzene-1,4-diamine), NPB (N,N'-nis-(1-naphthalenyl)-N,N'-bis-phenyl-(1,1'-biphenyl)-4,4'-diamine), NPNPB (N,N'-diphenyl-N,N'-di-[4-(N,N-diphenyl-amino)phenyl]benzidine), MeO-TPD (N,N,N',N'-tetrakis(4-methoxyphenyl)-benzidine), HAT-CN (1,4,5,8,9,11-hexaazatriphenylen-hexacarbonitrile) and/or Spiro-NPD (N,N'-diphenyl-N,N'-bis-(1-naphthyl)-9,9'-spirobifluorene-2,7-diamine).

Adjacent to the anode layer A or hole injection layer (HIL) typically a hole transport layer (HTL) is located. Herein, any hole transport compound may be used. Exemplarily, electron-rich heteroaromatic compounds such as triarylamines and/or carbazoles may be used as hole transport compound. The HTL may decrease the energy barrier between the anode layer A and the light-emitting layer B (serving as emitting layer (EML)). The hole transport layer (HTL) may also be an electron blocking layer (EBL). Preferably, hole transport compounds bear comparably high energy levels of their triplet states T1. Exemplarily the hole transport layer (HTL) may comprise a star-shaped heterocycle such as tris(4-carbazoyl-9-ylphenyl)amine (TCTA), poly-TPD (poly(4-butylphenyl-diphenyl-amine)), [alpha]-NPD (poly(4-butylphenyl-diphenyl-amine)), TAPC (4,4'-cyclohexyliden-bis[N,N-bis(4-methylphenyl)benzenamine]), 2-TNATA (4,4',4''-tris[2-naphthyl(phenyl)-amino]triphenylamine), Spiro-TAD, DNTPD, NPB, NPNPB, MeO-TPD, HAT-CN and/or TrisPcz (9,9'-diphenyl-6-(9-phenyl-9H-carbazol-3-yl)-9H,9'H-3,3'-bicarbazole). In addition, the HTL may comprise a p-doped layer, which may be composed of an inorganic or organic dopant in an organic hole-transporting matrix. Transition metal oxides such as vanadium oxide, molybdenum oxide or tungsten oxide may exemplarily be used as inorganic dopant. Tetrafluorotetracyanoquinodimethane (F4-TCNQ), copper-pentafluorobenzoate (Cu(I)pFBz) or transition metal complexes may exemplarily be used as organic dopant.

The EBL may exemplarily comprise mCP (1,3-bis(carbazol-9-yl)benzene), TCTA, 2-TNATA, mCBP (3,3-di(9H-carbazol-9-yl)biphenyl), 9-[3-(dibenzofuran-2-yl)phenyl]-9H-carbazole, 9-[3-(dibenzofuran-2-yl)phenyl]-9H-carbazole, 9-[3-(dibenzothiophen-2-yl)phenyl]-9H-carbazole, 9-[3,5-bis(2-dibenzofuranyl)phenyl]-9H-carbazole, 9-[3,5-bis(2-dibenzothiophenyl)phenyl]-9H-carbazole, tris-Pcz, CzSi (9-(4-tert-butylphenyl)-3,6-bis(triphenylsilyl)-9H-carbazole), 3',5'-di-(N-carbazolyl)-[1,1'-biphenyl]-2-carbonitrile (DCPBN; CAS 1918991-70-4), 3-(N-carbazolyl)-N-phenyl-carbazole (NCNPC) and/or DCB (N,N'-dicarbazolyl-1,4-dimethylbenzene).

Orbital and excited state energies can be determined by means of experimental methods known to the person skilled in the art. Experimentally, the energy of the highest occupied molecular orbital $E^{HOMO}$ is determined by methods known to the person skilled in the art from cyclic voltammetry measurements with an accuracy of 0.1 eV. The energy of the lowest unoccupied molecular orbital $E^{LUMO}$ is calculated as $E_{HOMO}+E^{gap}$, where $E^{gap}$ is determined as follows:
For host compounds, the onset of emission of a film with 10% by weight of host in poly(methyl methacrylate) (PMMA), which corresponds to the energy of the first excited singlet state S1, is used as $E^{gap}$, unless stated otherwise. For emitter compounds, $E^{gap}$ and thus the energy of the first excited singlet state S1 is determined in the same way, unless stated otherwise. For host compounds, the energy of the first excited triplet state T1 is determined from the onset of the time-gated emission spectrum at 77 K, typically with a delay time of 1 ms and an integration time of 1 ms, if not otherwise stated measured in a film of poly(methyl methacrylate) (PMMA) with 10% by weight of host. For TADF emitter compounds, the energy of the first excited triplet state T1 is determined from the onset of the time-gated emission spectrum at 77 K, typically with a delay time of 1 ms and an integration time of 1 ms.

In the electron transport layer (ETL), any electron transporter may be used. Exemplarily, compounds poor of electrons such as, e.g., benzimidazoles, pyridines, triazoles, oxadiazoles (e.g., 1,3,4-oxadiazole), phosphinoxides and sulfone, may be used. Exemplarily, an electron transporter ETM may also be a star-shaped heterocycle such as 1,3,5-tri(1-phenyl-1H-benzo[d]imidazol-2-yl)phenyl (TPBi). The ETM may exemplarily be NBphen (2,9-bis(naphthalen-2-yl)-4,7-diphenyl-1, 10-phenanthroline), Alq3 (Aluminum-tris(8-hydroxyquinoline)), TSPO1 (diphenyl-4-triphenylsilylphenyl-phosphinoxide), BPyTP2 (2,7-di(2,2'-bipyridin-5-yl)triphenyle), Sif87 (dibenzo[b,d]thiophen-2-yltriphenylsilane), Sif88 (dibenzo[b,d]thiophen-2-yl)diphenylsilane), BmPyPhB (1,3-bis[3,5-di(pyridin-3-yl)phenyl]benzene) and/or BTB (4,4'-bis-[2-(4,6-diphenyl-1,3, 5-triazinyl)]-1,1'-biphenyl). Optionally, the electron transport layer may be doped with materials such as Liq (8-hydroxyquinolinolatolithium). Optionally, a second electron transport layer may be located between electron transport layer and the cathode layer C. The electron transport layer (ETL) may also block holes or a hole-blocking layer (HBL) is introduced.

The HBL may, for example, comprise BCP (2,9-dimethyl-4,7-diphenyl-1,10-phenanthroline=Bathocuproine), BAlq (bis(8-hydroxy-2-methylquinoline)-(4-phenylphenoxy)aluminum), NBphen (2,9-bis(naphthalen-2-yl)-4,7-diphenyl-1, 10-phenanthroline), Alq3 (Aluminum-tris(8-hydroxyquinoline)), TSPO1 (diphenyl-4-triphenylsilylphenyl-phosphinoxide), T2T (2,4,6-tris(biphenyl-3-yl)-1,3,5-triazine), T3T (2,4,6-tris(triphenyl-3-yl)-1,3,5-triazine), TST (2,4,6-tris(9,9'-spirobifluorene-2-yl)-1,3,5-triazine), DTST (2,4-diphenyl-6-(3'-triphenylsilylphenyl)-1,3,5-triazine), DTDBF (2,8-bis(4,6-diphenyl-1,3,5-triazinyl)dibenzofurane) and/or TCB/TCP (1,3,5-tris(N-carbazolyl)benzol/1, 3,5-tris(carbazol)-9-yl) benzene).

Adjacent to the electron transport layer (ETL), a cathode layer C may be located. Exemplarily, the cathode layer C may comprise or may consist of a metal (e.g., Al, Au, Ag, Pt, Cu, Zn, Ni, Fe, Pb, LiF, Ca, Ba, Mg, In, W, or Pd) or a metal alloy. For practical reasons, the cathode layer C may also consist of (essentially) intransparent metals such as Mg, Ca or Al. Alternatively or additionally, the cathode layer C may also comprise graphite and or carbon nanotubes (CNTs). Alternatively, the cathode layer C may also consist of nanoscale silver wires.

An OLED may further, optionally, comprise a protection layer between the electron transport layer (ETL) D and the cathode layer C (which may be designated as electron injection layer (EIL)). This layer may comprise lithium fluoride, caesium fluoride, silver, Liq (8-hydroxyquinolinolatolithium), $Li_2O$, $BaF_2$, MgO and/or NaF.

As used herein, if not defined more specifically in a particular context, the designation of the colors of emitted and/or absorbed light is as follows:

violet: wavelength range of >380-420 nm;
deep blue: wavelength range of >420-475 nm;
sky blue: wavelength range of >475-500 nm;
green: wavelength range of >500-560 nm;
yellow: wavelength range of >560-580 nm;
orange: wavelength range of >580-620 nm;
red: wavelength range of >620-800 nm.

With respect to emitter compounds, such colors refer to the emission maximum $\lambda_{max}^{PMMA}$ of a poly(methyl methacrylate) (PMMA) film with 10% by weight of the emitter. Therefore, exemplarily, a deep blue emitter has an emission maximum $\lambda_{max}^{PMMA}$ in the range of from 420 to 475 nm, a sky blue emitter has an emission maximum $\lambda_{max}^{PMMA}$ in the range of from 475 to 500 nm, a green emitter has an emission maximum $\lambda_{max}^{PMMA}$ in a range of from 500 to 560 nm, a red emitter has an emission maximum $\lambda_{max}^{PMMA}$ in a range of from 620 to 800 nm.

A deep blue emitter may preferably have an emission maximum $\lambda_{max}^{PMMA}$ of not more than 475 nm, more preferably below 470 nm, even more preferably below 465 nm or even below 460 nm. It will typically be above 420 nm, preferably above 430 nm, more preferably of at least 440 nm. In a preferred embodiment, the device exhibits an emission maximum $\lambda_{max}^{PMMA}(D)$ of 420 to 475 nm, 430 to 470 nm, 440 to 465 nm, or 450 to 460 nm. In a preferred embodiment, the device exhibits an emission maximum $\lambda_{max}^{PMMA}(D)$ of 440 to 475 nm. In a preferred embodiment, the device exhibits an emission maximum $\lambda_{max}^{PMMA}(D)$ of 450 to 470 nm.

Accordingly, a further embodiment of the present invention relates to an OLED, which exhibits an external quantum efficiency at 1000 cd/m² of more than 10%, more preferably of more than 13%, more preferably of more than 15%, even more preferably of more than 18% or even more than 20% and/or exhibits an emission maximum between 420 nm and 500 nm, preferably between 430 nm and 490 nm, more preferably between 440 nm and 480 nm, even more preferably between 450 nm and 470 nm and/or exhibits a LT80 value at 500 cd/m² of more than 100 h, preferably more than 200 h, more preferably more than 400 h, even more preferably more than 750 h or even more than 1000 h.

A further embodiment of the present invention relates to an OLED, which emits light at a distinct color point. According to the present invention, the OLED emits light with a narrow emission band (small full width at half maximum (FWHM)). In a preferred embodiment, the OLED according to the invention emits light with a FWHM of the main emission peak of below 0.30 eV, more preferably of below 0.25 eV, even more preferably of below 0.20 eV or even below 0.18 eV.

A further aspect of the present invention relates to an OLED, which emits light with CIEx and CIEy color coordinates close to the CIEx (=0.131) and CIEy (=0.046) color coordinates of the primary color blue (CIEx=0.131 and CIEy=0.046) as defined by ITU-R Recommendation BT.2020 (Rec. 2020) and thus is suited for the use in Ultra High Definition (UHD) displays, e.g. UHD-TVs. In commercial applications, typically top-emitting (top-electrode is transparent) devices are used, whereas test devices as used throughout the present application represent bottom-emitting devices (bottom-electrode and substrate are transparent). The CIEy color coordinate of a blue device can be reduced by up to a factor of two, when changing from a bottom- to a top-emitting device, while the CIEx remains nearly unchanged (Okinaka et al., Society for Information Display International Symposium Digest of Technical Papers, 2015, 46(1):312-313, DOI:10.1002/sdtp.10480).

Accordingly, a further aspect of the present invention relates to an OLED, whose emission exhibits a CIEx color coordinate of between 0.02 and 0.30, preferably between 0.03 and 0.25, more preferably between 0.05 and 0.20 or even more preferably between 0.08 and 0.18 or even between 0.10 and 0.15 and/or a CIEy color coordinate of between 0.00 and 0.45, preferably between 0.01 and 0.30, more preferably between 0.02 and 0.20 or even more preferably between 0.03 and 0.15 or even between 0.04 and 0.10.

As used throughout the present application, the terms "aryl" and "aromatic" may be understood in the broadest sense as any mono-, bi- or polycyclic aromatic moieties. If not otherwise indicated, an aryl may also be optionally substituted by one or more substituents which are exemplified further throughout the present application. Accordingly, the term "arylene" refers to a divalent residue that bears two binding sites to other molecular structures and thereby serving as a linker structure. As used throughout the present application, the terms "heteroaryl" and "heteroaromatic" may be understood in the broadest sense as any mono-, bi- or polycyclic heteroaromatic moieties that include at least one heteroatom, in particular which bear from one to three heteroatoms per aromatic ring.

Exemplarily, a heteroaromatic compound may be pyrrole, furan, thiophene, imidazole, oxazole, thiazole, triazole, pyrazole, pyridine, pyrazine and pyrimidine, and the like. If not otherwise indicated, a heteroaryl may also be optionally substituted by one or more substituents which are exemplified further throughout the present application. Accordingly, the term "heteroarylene" refers to a divalent residue that bears two binding sites to other molecular structures and thereby serving as a linker structure.

As used throughout the present application, the term "alkyl" may be understood in the broadest sense as both, linear or branched chain alkyl residue. Preferred alkyl residues are those containing from one to fifteen carbon atoms. Exemplarily, an alkyl residue may be methyl, ethyl, propyl, isopropyl, butyl, isobutyl, tert-butyl, and the like. If not otherwise indicated, an alkyl may also be optionally substituted by one or more substituents which are exemplified further throughout the present application. Accordingly, the term "alkylene" refers to a divalent residue that bears two binding sites to other molecular structures and thereby serving as a linker structure.

If not otherwise indicated, as used herein, in particular in the context of aryl, arylene, heteroaryl, alkyl and the like, the term "substituted" may be understood in the broadest sense. Preferably, such substitution means a residue selected from the group consisting of $C_1$-$C_{20}$-alkyl, $C_7$-$C_{19}$-alkaryl, and $C_6$-$C_{18}$-aryl. Accordingly, preferably, no charged moiety, more preferably no functional group is present in such substitution.

It will be noticed that hydrogen can, at each occurrence, be replaced by deuterium.

Unless otherwise specified, any of the layers of the various embodiments may be deposited by any suitable method. The layers in the context of the present invention, including the light-emitting layer B, may optionally be prepared by means of liquid processing (also designated as "film processing", "fluid processing", "solution processing" or "solvent processing"). This means that the components comprised in the respective layer are applied to the surface of a part of a device in liquid state. Preferably, the layers in the context of the present invention, including the light-emitting layer B, may be prepared by means of spin-coating. This method well-known to those skilled in the art allows obtaining thin and (essentially) homogeneous layers.

Alternatively, the layers in the context of the present invention, including the light-emitting layer B, may be prepared by other methods based on liquid processing such as, e.g., casting (e.g., drop-casting) and rolling methods, and printing methods (e.g., inkjet printing, gravure printing, blade coating). This may optionally be carried out in an inert atmosphere (e.g., in a nitrogen atmosphere).

In another preferred embodiment, the layers in the context of the present invention may be prepared by any other method known in the art, including but not limited to vacuum processing methods well-known to those skilled in the art such as, e.g., thermal (co-)evaporation, organic vapor phase deposition (OVPD), and deposition by organic vapor jet printing (OVJP).

When preparing layers by means of liquid processing, the solutions including the components of the layers (i.e., with respect to the light-emitting layer B of the present invention, at least one host compound $H^B$ and, typically, at least one first TADF material $E^B$, at least one second TADF material $S^B$ and optionally one or more other host compounds $H^{B2}$) may further comprise a volatile organic solvent. Such volatile organic solvent may optionally be one selected from the group consisting of tetrahydrofuran, dioxane, chlorobenzene, diethylene glycol diethyl ether, 2-(2-ethoxyethoxy) ethanol, gamma-butyrolactone, N-methyl pyrrolidinon, ethoxyethanol, xylene, toluene, anisole, phenetol, acetonitrile, tetrahydrothiophene, benzonitrile, pyridine, trihydrofuran, triarylamine, cyclohexanone, acetone, propylene carbonate, ethyl acetate, benzene and PGMEA (propylen glycol monoethyl ether acetate). Also a combination of two or more solvents may be used. After applied in liquid state, the layer may subsequently be dried and/or hardened by any means of the art, exemplarily at ambient conditions, at increased temperature (e.g., about 50° C. or about 60° C.) or at diminished pressure.

Optionally, an organic electroluminescent device (e.g., an OLED) may exemplarily be an essentially white organic electroluminescent device or a blue organic electroluminescent device. Exemplarily such white organic electroluminescent device may comprise at least one (deep) blue emitter compound (e.g., TADF material $E^B$) and one or more emitter compounds emitting green and/or red light. Then, there may also optionally be energy transmittance between two or more compounds as described above.

The organic electroluminescent device as a whole may also form a thin layer of a thickness of not more than 5 mm, more than 2 mm, more than 1 mm, more than 0.5 mm, more than 0.25 mm, more than 100 µm, or more than 10 µm.

An organic electroluminescent device (e.g., an OLED) may be a small-sized (e.g., having a surface not larger than 5 mm$^2$, or even not larger than 1 mm$^2$), medium-sized (e.g., having a surface in the range of 0.5 to 20 cm$^2$), or a large-sized (e.g., having a surface larger than 20 cm$^2$). An organic electroluminescent device (e.g., an OLED) according to the present invention may optionally be used for generating screens, as large-area illuminating device, as luminescent wallpaper, luminescent window frame or glass, luminescent label, luminescent poser or flexible screen or display. Next to the common uses, an organic electroluminescent device (e.g., an OLED) may exemplarily also be used as luminescent films, "smart packaging" labels, or innovative design elements. Further they are usable for cell detection and examination (e.g., as bio labelling).

One of the main purposes of an organic electroluminescent device is the generation of light. Thus, the present invention further relates to a method for generating light of a desired wavelength range, comprising the step of providing an organic electroluminescent device according to any the present invention.

Accordingly, a further aspect of the present invention relates to a method for generating light of a desired wavelength range, comprising the steps of
(i) providing an organic electroluminescent device according to the present invention; and
(ii) applying an electrical current to said organic electroluminescent device.

A further aspect of the present invention relates to a process of making the organic electroluminescent devices by assembling the elements described above. The present invention also relates to a method for generating blue, green, yellow, orange, red or white light, in particular blue or white light by using said organic electroluminescent device.

The Examples and claims further illustrate the invention.

EXAMPLES

Cyclic Voltammetry

Cyclic voltammograms of solutions having concentration of $10^{-3}$ mol/l of the organic molecules in dichloromethane or a suitable solvent and a suitable supporting electrolyte (e.g. 0.1 mol/l of tetrabutylammonium hexafluorophosphate) are measured. The measurements are conducted at room temperature and under nitrogen atmosphere with a three-electrode assembly (Working and counter electrodes: Pt wire, reference electrode: Pt wire) and calibrated using $FeCp_2/FeCp_2^+$ as internal standard. HOMO data was corrected using ferrocene as internal standard against SCE.

Density Functional Theory Calculation

Molecular structures are optimized employing the BP86 functional and the resolution of identity approach (RI). Excitation energies are calculated using the (BP86) optimized structures employing Time-Dependent DFT (TD-DFT) methods. Orbital and excited state energies are calculated with the B3LYP functional. Def2-SVP basis sets (and a m4-grid for numerical integration were used. The Turbomole program package was used for all calculations.

Photophysical Measurements

Sample pretreatment: Spin-coating
Apparatus: Spin150, SPS euro.

The sample concentration is 10 mg/ml, dissolved in a suitable solvent.

Program: 1) 3 s at 400 U/min; 20 s at 1000 U/min at 1000 Upm/s. 3) 10 s at 4000 U/min at 1000 Upm/s. After coating, the films are tried at 70° C. for 1 min.

Photoluminescence Spectroscopy and TCSPC (Time-Correlated Single-Photon Counting)

Steady-state emission spectroscopy is recorded using a Horiba Scientific, Modell FluoroMax-4 equipped with a 150 W Xenon-Arc lamp, excitation- and emissions monochromators and a Hamamatsu R928 photomultiplier and a time-correlated single-photon counting option. Emissions and excitation spectra are corrected using standard correction fits.

Excited state lifetimes are determined employing the same system using the TCSPC method with FM-2013 equipment and a Horiba Yvon TCSPC hub.

Excitation Sources:
NanoLED 370 (wavelength: 371 nm, puls duration: 1.1 ns)
NanoLED 290 (wavelength: 294 nm, puls duration: <1 ns)
SpectraLED 310 (wavelength: 314 nm)
SpectraLED 355 (wavelength: 355 nm).

Data analysis (exponential fit) was done using the software suite DataStation and DAS6 analysis software. The fit is specified using the chi-squared-test.

Photoluminescence Quantum Yield Measurements

For photoluminescence quantum yield (PLQY) measurements an Absolute PL Quantum Yield Measurement C9920-03G system (Hamamatsu Photonics) is used. Quantum yields and CIE coordinates were determined using the software U6039-05 version 3.6.0.

Emission maxima are given in nm, quantum yields φ in % and CIE coordinates as x,y values.

PLQY was determined using the following protocol:
1) Quality assurance: Anthracene in ethanol (known concentration) is used as reference
2) Excitation wavelength: the absorption maximum of the organic molecule is determined and the molecule is excited using this wavelength
3) Measurement
   Quantum yields are measured for sample of solutions or films under nitrogen atmosphere. The yield is calculated using the equation:

$$\Phi_{PL} = \frac{n_{photon},\ emited}{n_{photon},\ absorbed} = \frac{\int \frac{\lambda}{hc}[Int_{emitted}^{sample}(\lambda) - Int_{absorbed}^{sample}(\lambda)]d\lambda}{\int \frac{\lambda}{hc}[int_{emitted}^{reference}(\lambda) - Int_{absorbed}^{reference}(\lambda)]d\lambda}$$

wherein $n_{photon}$ denotes the photon count and Int. is the intensity.

Production and Characterization of Organic Electroluminescence Devices

Via vacuum-deposition methods OLED devices comprising organic molecules according to the invention can be produced. If a layer contains more than one compound, the weight-percentage of one or more compounds is given in %. The total weight-percentage values amount to 100%, thus if a value is not given, the fraction of this compound equals to the difference between the given values and 100%.

The not fully optimized OLEDs are characterized using standard methods and measuring electroluminescence spectra, the external quantum efficiency (in %) in dependency on the intensity, calculated using the light detected by the photodiode, and the current. The OLED device lifetime is extracted from the change of the luminance during operation at constant current density. The LT50 value corresponds to the time, where the measured luminance decreased to 50% of the initial luminance, analogously LT80 corresponds to the time point, at which the measured luminance decreased to 80% of the initial luminance, LT97 to the time point, at which the measured luminance decreased to 97% of the initial luminance etc.

Accelerated lifetime measurements are performed (e.g. applying increased current densities). Exemplarily LT80 values at 500 cd/m² are determined using the following equation:

$$LT80\left(500\frac{cd^2}{m^2}\right) = LT80(L_0)\left(\frac{L_0}{500\frac{cd^2}{m^2}}\right)^{1.6}$$

wherein $L_0$ denotes the initial luminance at the applied current density.

The values correspond to the average of several pixels (typically two to eight), the standard deviation between these pixels is given. Figures show the data series for one OLED pixel.

Example D1 and Comparative Examples C1 and C2

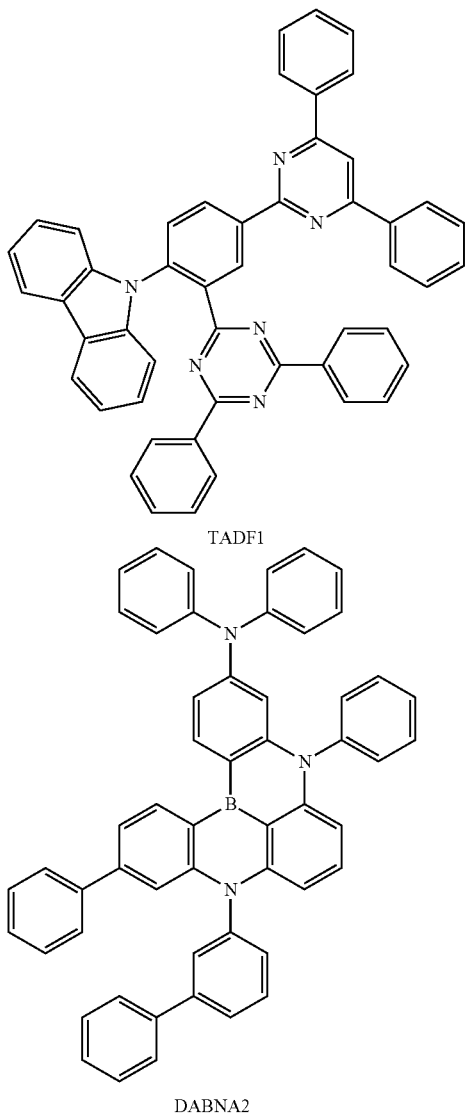

TADF1

DABNA2

TABLE 2

Setup of an example organic electroluminescent device (OLED) (the percentages refer to weight percent)

| Layer | Thickness | D1 | C1 | C2 |
|---|---|---|---|---|
| 9 | 100 nm | Al | Al | Al |
| 8 | 2 nm | Liq | Liq | Liq |
| 7 | 20 nm | NBPhen | NBPhen | NBPhen |
| 6 | 10 nm | DTDBF | DTDBF | DTDBF |
| 6 | 50 nm | TADF1 (20%): DABNA2 (2%): NCNPC (25%): DCPBN (53%) | TADF1 (20%): NCNPC (25%): DCPBN (55%) | DABNA2 (2%): NCNPC (29%): DCPBN (69%) |
| 5 | 10 nm | NCNPC | NCNPC | NCNPC |
| 4 | 10 nm | TCTA | TCTA | TCTA |
| 3 | 40 nm | NPB | NPB | NPB |
| 2 | 5 nm | HAT-CN | HAT-CN | HAT-CN |
| 1 | 50 nm | ITO | ITO | ITO |
| substrate | | glass | glass | glass |

Device D1 yielded an external quantum efficiency (EQE) at 1000 cd/m² of 16.8±0.3%. The LT80 value at 500 cd/m² was determined to be 23 h from accelerated lifetime measurements. The emission maximum is at 469 nm with a FWHM of 31 nm at 5 V. The corresponding CIEy is 0.160 and CIEx is 0.127.

Comparative devices C1 and C2 comprise the same layer arrangement as device D1, except that the emitting layer contains only emitter TADF1 (C1) or DABNA2 (C2).

For device C1, the EQE at 1000 cd/m² is significantly reduced to 7.7±0.1% and the lifetime is shorter (LT80 at 500 cd/m²=8 h). The emission maximum is at 461 nm, but due to the larger FWHM of 58 nm at 5 V, the corresponding CIEy is 0.150 and thus only slightly below the CIEy of D1. In addition, the corresponding CIEx is at 0.145 and thus inferior compared to D1.

For device C2, the EQE at 1000 cd/m² is lower than for D1 at 12.6±0.4% and the lifetime is significantly shorter (LT80 at 500 cd/m²=6 h). The emission maximum is at 469 nm, but due to the small FWHM of 28 nm at 5 V, the corresponding CIEy is 0.121 and CIEx is 0.124.

The invention claimed is:
1. An organic electroluminescent device comprising a light-emitting layer B comprising:
(i) a host material $H^N$, which has a lowermost excited singlet state energy level $S1^N$, a lowermost excited triplet state energy level $T1^N$, a highest occupied molecular orbital HOMO($H^N$) having an energy $E^{HOMO}(H^N)$ and a lowest unoccupied molecular orbital LUMO($H^N$) having an energy $E^{LUMO}(H^N)$;
(ii) a host material $H^P$, which has a lowermost excited singlet state energy level $S1^P$ and a lowermost excited triplet state energy level $T1^P$, a highest occupied molecular orbital HOMO($H^P$) having an energy

TABLE 1

Properties of the materials.

| | Example compound | HOMO [eV] | LUMO [eV] | S1 [eV] | T1 [eV] | $\lambda_{max}^{PMMA}$ [nm] | FWHM [eV] |
|---|---|---|---|---|---|---|---|
| Host $H^P$ | NCNPC | −5.80 | −2.29 | 3.51 | 3.05* | | |
| Host $H^N$ | DCPBN | −6.04 | −2.70 | 3.34 | | | |
| TADF material $E^B$ | TADF1 | −6.02 | −2.98 | 3.04 | 2.74 | 450 | 0.41 |
| emitter $S^B$ | DABNA2 | −5.45 | −2.68 | 2.77 | | 470 | 0.21 |

*measured in 2-Me—THF solution $E^{HUMO}(H^P)$ and a lowest unoccupied molecular orbital LUMO($H^P$) having an energy $E^{HUMO}(H^P)$;

(iii) a thermally activated delayed fluorescence (TADF) material $E^B$, which has a lowermost excited singlet state energy level $S1^E$ and a lowermost excited triplet state energy level $T1^E$, a highest occupied molecular orbital HOMO($E^E$) having an energy $E^{HOMO}(E^E)$ and a lowest unoccupied molecular orbital LUMO($E^E$) having an energy $E^{LUMO}(E^E)$; and (iv) a small full width at half maximum (FWHM) emitter $S^B$, which has a lowermost excited singlet state energy level $S1^S$ and a lowermost excited triplet state energy level $T1^S$, a highest occupied molecular orbital HOMO ($E^S$) having an energy $E^{HOMO}(E^S)$ and a lowest unoccupied molecular orbital LUMO($E^S$) having an energy $E^{LUMO}(E^S)$, wherein $S^B$ emits light with an emission maximum $\lambda_{max}^{PMMA}(S)$ of 440 nm to 475 nm, wherein the relations expressed by the following formulas (1) to (3) and at least one of (4a) or (4b) apply:

$$S1^N > S1^E \quad (1),$$

$$S1^P > S1^E \quad (2),$$

$$E^{LUMO}(H^N) - E^{HOMO}(H^P) > S1^E \quad (3),$$

$$E^{LUMO}(H^P) - E^{LUMO}(H^N) \geq 0.2 \text{ eV} \quad (4a),$$

$$E^{HOMO}(H^P) - E^{HOMO}(H^N) \geq 0.2 \text{ eV} \quad (4b),$$

and wherein the relations expressed by the following formulas (5) to (8) apply:

$$S1^N > S1^S \quad (5),$$

$$S1^P > S1^S \quad (6),$$

$$S1^E > S1^S \quad (7),$$

$$S1^S < 2.95 \text{ eV} \quad (8).$$

2. The organic electroluminescent device according to claim 1, wherein said organic electroluminescent device is a device selected from the group consisting of an organic light emitting diode, a light emitting electrochemical cell, and a light-emitting transistor.

3. The organic electroluminescent device according to claim 1, wherein the TADF material $E^B$ is an organic TADF material.

4. The organic electroluminescent device according to claim 1, wherein formulas (4a) and (4b) apply.

5. The organic electroluminescent device according to claim 1, wherein the device exhibits an emission maximum $\lambda_{max}(D)$ of 440 to 475 nm.

6. The organic electroluminescent device according to claim 5, wherein the device exhibits an emission maximum $\lambda_{max}(D)$ of 450 to 470 nm.

7. The organic electroluminescent device according to claim 1, wherein the light-emitting layer B comprises:
(i) 10-84% by weight of the host compound $H^P$;
(ii) 10-84% by weight of the host compound $H^N$;
(iii) 5-50% by weight of the TADF material $E^B$; and
(iv) 1-10% by weight of the emitter $S^B$; and optionally
(v) 0-74% by weight of one or more solvents.

8. The organic electroluminescent device according to claim 1, wherein the light-emitting layer B comprises:
(i) 10-30% by weight of the host compound $H^P$;
(ii) 40-74% by weight of the host compound $H^N$;
(iii) 15-30% by weight of the TADF material $E^B$; and
(iv) 1-5% by weight of the emitter $S^B$; and optionally
(v) 0-34% by weight of one or more solvents.

9. The organic electroluminescent device according to claim 1, wherein the TADF material $E^B$ exhibits an emission maximum $\lambda_{max}^{PMMA}(E^B)$ in the range from 440 to 470 nm.

10. The organic electroluminescent device according to claim 1, wherein the small FWHM emitter $S^B$ is an organic near-range-charge-transfer (NRCT) emitter.

11. The organic electroluminescent device according to claim 1, wherein the small FWHM emitter $S^B$ comprises or consists of a structure according to Formula I:

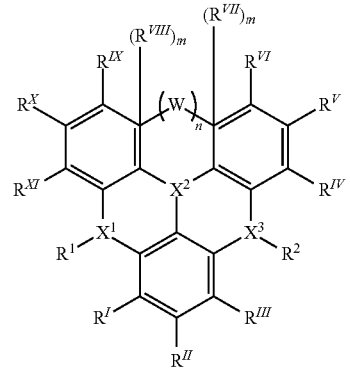

Formula I wherein
n is 0 or 1;
m=1−n;
$X^1$ is N or B;
$X^2$ is N or B;
$X^3$ is N or B;
W is selected from the group consisting of $Si(R^3)_2$, $C(R^3)_2$ and $BR^3$;
each of $R^1$, $R^2$ and $R^3$ is independently from each other selected from the group consisting of:
$C_1$-$C_5$-alkyl,
which is optionally substituted with one or more substituents $R^6$;
$C_6$-$C_{60}$-aryl,
which is optionally substituted with one or more substituents $R^6$; and
$C_3$-$C_{57}$-heteroaryl,
which is optionally substituted with one or more substituents $R^6$;
each of $R^I$, $R^{II}$, $R^{III}$, $R^{IV}$, $R^V$, $R^{VI}$, $R^{VII}$, $R^{VIII}$, $R^{IX}$, $R^X$, and $R^{XI}$ is independently from another selected from the group consisting of:
hydrogen, deuterium, $N(R^5)_2$, $OR^5$, $Si(R^5)_3$, $B(OR^5)_2$, $OSO_2R^5$, $CF_3$, CN, halogen,
$C_1$-$C_{40}$-alkyl,
which is optionally substituted with one or more substituents $R^5$ and
wherein one or more non-adjacent $CH_2$-groups are each optionally substituted by $R^5C=CR^5$, $C\equiv C$, $Si(R^5)_2$, $Ge(R^5)_2$, $Sn(R^5)_2$, C=O, C=S, C=Se, $C=NR^5$, $P(=O)(R^5)$, SO, $SO_2$, $NR^5$, O, S or $CONR^5$;
$C_1$-$C_{40}$-alkoxy,
which is optionally substituted with one or more substituents $R^5$ and
wherein one or more non-adjacent $CH_2$-groups are each optionally substituted by $R^5C=CR^5$, $C\equiv C$, $Si(R^5)_2$, $Ge(R^5)_2$, $Sn(R^5)_2$, C=O, C=S, C=Se, $C=NR^5$, $P(=O)(R^5)$, SO, $SO_2$, $NR^5$, O, S or $CONR^5$;

$C_1$-$C_{40}$-thioalkoxy,
  which is optionally substituted with one or more substituents $R^5$ and
  wherein one or more non-adjacent $CH_2$-groups are each optionally substituted by $R^5C=CR^5$, $C\equiv C$, $Si(R^5)_2$, $Ge(R^5)_2$, $Sn(R^5)_2$, $C=O$, $C=S$, $C=Se$, $C=NR^5$, $P(=O)(R^5)$, $SO$, $SO_2$, $NR^5$, $O$, $S$ or $CONR^5$;
$C_2$-$C_{40}$-alkenyl,
  which is optionally substituted with one or more substituents $R^5$ and
  wherein one or more non-adjacent $CH_2$-groups are each optionally substituted by $R^5C=CR^5$, $C\equiv C$, $Si(R^5)_2$, $Ge(R^5)_2$, $Sn(R^5)_2$, $C=O$, $C=S$, $C=Se$, $C=NR^5$, $P(=O)(R^5)$, $SO$, $SO_2$, $NR^5$, $O$, $S$ or $CONR^5$;
$C_2$-$C_{40}$-alkynyl,
  which is optionally substituted with one or more substituents $R^5$ and
  wherein one or more non-adjacent $CH_2$-groups are each optionally substituted by $R^5C=CR^5$, $C\equiv C$, $Si(R^5)_2$, $Ge(R^5)_2$, $Sn(R^5)_2$, $C=O$, $C=S$, $C=Se$, $C=NR^5$, $P(=O)(R^5)$, $SO$, $SO_2$, $NR^5$, $O$, $S$ or $CONR^5$;
$C_6$-$C_{60}$-aryl,
  which is optionally substituted with one or more substituents $R^5$; and
$C_3$-$C_{57}$-heteroaryl,
  which is optionally substituted with one or more substituents $R^5$;
$R^5$ is at each occurrence independently from another selected from the group consisting of: hydrogen, deuterium, OPh, $CF_3$, CN, F,
$C_1$-$C_5$-alkyl,
  wherein optionally one or more hydrogen atoms are independently from each other substituted by deuterium, CN, $CF_3$, or F;
$C_1$-$C_5$-alkoxy,
  wherein optionally one or more hydrogen atoms are independently from each other substituted by deuterium, CN, $CF_3$, or F;
$C_1$-$C_5$-thioalkoxy,
  wherein optionally one or more hydrogen atoms are independently from each other substituted by deuterium, CN, $CF_3$, or F;
$C_2$-$C_5$-alkenyl,
  wherein optionally one or more hydrogen atoms are independently from each other substituted by deuterium, CN, $CF_3$, or F;
$C_2$-$C_5$-alkynyl,
  wherein optionally one or more hydrogen atoms are independently from each other substituted by deuterium, CN, $CF_3$, or F;
$C_6$-$C_{18}$-aryl,
  which is optionally substituted with one or more $C_1$-$C_5$-alkyl substituents;
$C_3$-$C_{17}$-heteroaryl,
  which is optionally substituted with one or more $C_1$-$C_5$-alkyl substituents;
$N(C_6$-$C_{18}$-aryl$)_2$,
$N(C_3$-$C_{17}$-heteroaryl$)_2$; and
$N(C_3$-$C_{17}$-heteroaryl$)(C_6$-$C_{18}$-aryl$)$;
$R^6$ is at each occurrence independently from another selected from the group consisting of hydrogen, deuterium, OPh, $CF_3$, CN, F,
$C_1$-$C_5$-alkyl,
  wherein optionally one or more hydrogen atoms are independently from each other substituted by deuterium, CN, $CF_3$, or F;
$C_1$-$C_5$-alkoxy,
  wherein optionally one or more hydrogen atoms are independently from each other substituted by deuterium, CN, $CF_3$, or F;
$C_1$-$C_5$-thioalkoxy,
  wherein optionally one or more hydrogen atoms are independently from each other substituted by deuterium, CN, $CF_3$, or F;
$C_2$-$C_5$-alkenyl,
  wherein optionally one or more hydrogen atoms are independently from each other substituted by deuterium, CN, $CF_3$, or F;
$C_2$-$C_5$-alkynyl,
  wherein optionally one or more hydrogen atoms are independently from each other substituted by deuterium, CN, $CF_3$, or F;
$C_6$-$C_{18}$-aryl,
  which is optionally substituted with one or more $C_1$-$C_5$-alkyl substituents;
$C_3$-$C_{17}$-heteroaryl,
  which is optionally substituted with one or more $C_1$-$C_5$-alkyl substituents;
$N(C_6$-$C_{18}$-aryl$)_2$,
$N(C_3$-$C_{17}$-heteroaryl$)_2$; and
$N(C_3$-$C_{17}$-heteroaryl$)(C_6$-$C_{18}$-aryl$)$;
wherein two or more of the substituents selected from the group consisting of $R^I$, $R^{II}$, $R^{III}$, $R^{IV}$, $R^V$, $R^{VI}$, $R^{VII}$, $R^{VIII}$, $R^{IX}$, $R^X$, and $R^{XI}$ that are positioned adjacent to another may each form a ring system with another, said ring system selected from the group consisting of a mono- or polycyclic, aliphatic, aromatic and benzofused ring system; and
wherein at least one of $X^1$, $X^2$ and $X^3$ is B and at least one of $X^1$, $X^2$ and $X^3$ is N.

12. The organic electroluminescent device according to claim 11, wherein $X^1$ and $X^3$ each are N and $X^2$ is B.

13. The organic electroluminescent device according to claim 11, wherein $X^1$ and $X^3$ each are B and $X^2$ is N.

14. The organic electroluminescent device according to claim 11, wherein n=0.

15. The organic electroluminescent device according to claim 11, wherein each of $R^I$, $R^{II}$, $R^{III}$, $R^{IV}$, $R^V$, $R^{VI}$, $R^{VII}$, $R^{VIII}$, $R^{IX}$, $R^X$, and $R^{XI}$ is independently from another selected from the group consisting of:
  hydrogen, deuterium, halogen, Me, $^iPr$, $^tBu$, CN, $CF_3$,
  Ph, which is optionally substituted with one or more substituents independently from each other selected from the group consisting of Me, $^iPr$, $^tBu$, CN, $CF_3$, and Ph,
  pyridinyl, which is optionally substituted with one or more substituents independently from each other selected from the group consisting of Me, $^iPr$, $^tBu$, CN, $CF_3$, and Ph,
  pyrimidinyl, which is optionally substituted with one or more substituents independently from each other selected from the group consisting of Me, $^iPr$, $^tBu$, CN, $CF_3$, and Ph,
  carbazolyl, which is optionally substituted with one or more substituents independently from each other selected from the group consisting of Me, $^iPr$, $^tBu$, CN, $CF_3$, and Ph,
  triazinyl, which is optionally substituted with one or more substituents independently from each other selected from the group consisting of Me, $^iPr$, $^tBu$, CN, $CF_3$, and Ph, and $N(Ph)_2$; and $R^1$ and $R^2$ is each independently from each other selected from the group consisting of $C_1$-$C_5$-alkyl,
   which is optionally substituted with one or more substituents $R^6$;

$C_6$-$C_{30}$-aryl,
   which is optionally substituted with one or more substituents $R^6$; and $C_3$-$C_{30}$-heteroaryl,
   which is optionally substituted with one or more substituents $R^6$.

16. A method for generating blue light at a wavelength of from 440 to 475 nm, comprising the steps of:
  (i) providing an organic electroluminescent device according to claim 1; and
  (ii) applying an electrical current to said organic electroluminescent device.

* * * * *